US009564862B2

(12) United States Patent
Høyerby

(10) Patent No.: US 9,564,862 B2
(45) Date of Patent: Feb. 7, 2017

(54) CLASS D AUDIO AMPLIFIER WITH ADJUSTABLE LOOP FILTER CHARACTERISTICS

(71) Applicant: Merus Audio ApS, Herlev (DK)

(72) Inventor: Mikkel Høyerby, Copenhagen (DK)

(73) Assignee: Merus Audio APS, Herlev (DK)

( * ) Notice: Subject to any disclaimer, the term of this patent is extended or adjusted under 35 U.S.C. 154(b) by 0 days.

(21) Appl. No.: 14/396,922

(22) PCT Filed: Apr. 24, 2013

(86) PCT No.: PCT/EP2013/058450
§ 371 (c)(1),
(2) Date: Oct. 24, 2014

(87) PCT Pub. No.: WO2013/164229
PCT Pub. Date: Nov. 7, 2013

(65) Prior Publication Data
US 2015/0288335 A1 Oct. 8, 2015

Related U.S. Application Data

(60) Provisional application No. 61/640,565, filed on Apr. 30, 2012.

(51) Int. Cl.
*H03F 3/38* (2006.01)
*H03F 3/217* (2006.01)
(Continued)

(52) U.S. Cl.
CPC ............ *H03F 3/217* (2013.01); *H03F 1/0205* (2013.01); *H03F 3/183* (2013.01); *H03F 2200/03* (2013.01); *H03F 2200/351* (2013.01)

(58) Field of Classification Search
CPC ........ H03F 3/68; H03F 3/2171; H03F 3/2173; H03F 2200/331
(Continued)

(56) References Cited

U.S. PATENT DOCUMENTS 8,212,612 B2 * 7/2012 Song ...................... H03F 3/217 330/10
2003/0087621 A1 5/2003 Roeckner et al.
(Continued)

FOREIGN PATENT DOCUMENTS

CN 1232990 C 10/1999
CN 102356544 2/2012
(Continued)

OTHER PUBLICATIONS

Maxim Integrated data sheet for MAX274/MAX275, Maxim Integrated, San Jose, CA, USA, 1996.*
(Continued)

*Primary Examiner* — Steven J Mottola
*Assistant Examiner* — Hafizur Rahman
(74) *Attorney, Agent, or Firm* — Peter A. Nieves; Sheehan Phinney Bass & Green PA

(57) ABSTRACT

The present invention relates to a class D audio amplifier comprising a pulse width modulator, an adjustable loop filter and a feedback loop. The pulse width modulator generates a first set of pulse width modulated control signals at an adjustable modulation frequency for respective switch control terminals of a first output driver. A controller of the class D audio amplifier is configured to control frequency response characteristics of the adjustable loop filter based on a frequency setting of the adjustable modulation frequency.

28 Claims, 17 Drawing Sheets

Feedback attenuator
1111
Audio In
1131
1117
K1
kn
1115
PWM
1119
Switching pattern mapping
1133
Timing control
1121
PWM clock
1123
Clock man
1125
Power man
1129
1127
1109
Gate drive
1107
Power stage
1105
Output filter
1100
1103
1101

(51) Int. Cl.

*H03F 1/02* (2006.01)

*H03F 3/183* (2006.01)

(58) Field of Classification Search

USPC ... 327/131–137; 330/10, 207 A, 251; 347/9; 381/120

See application file for complete search history.

(56) References Cited

U.S. PATENT DOCUMENTS

| | | | |
|---|---|---|---|
| 2003/0216132 | A1 | 11/2003 | Sawashi et al. |
| 2007/0286273 | A1 | 12/2007 | Clara |
| 2010/0239102 | A1* | 9/2010 | Miao ......................... H03F 1/26 381/73.1 |
| 2012/0013402 | A1 | 1/2012 | Song et al. |

FOREIGN PATENT DOCUMENTS

| | | | |
|---|---|---|---|
| GB | 2452790 | A | 3/2009 |
| JP | 2004072707 | A * | 3/2004 |
| WO | WO03041269 | | 5/2003 |
| WO | 2012055968 | A1 | 5/2012 |

OTHER PUBLICATIONS

"Scalable Output Power Approach Saves Time-To-Market in Audio Amplifier Design", Manuel Rodriguez, Electronic Design, Jan. 2010.*

International Rectifier date sheet for IRFI4019H-117P, International Rectifier, IR World Headquarters: 233 Kansas St., El Segundo, California 90245, USA, Aug. 2006.*

* cited by examiner

CLASS D AUDIO AMPLIFIER WITH ADJUSTABLE LOOP FILTER CHARACTERISTICS

The present invention relates to a class D audio amplifier comprising a pulse width modulator, an adjustable loop filter and a feedback loop. The pulse width modulator generates a first set of pulse width modulated control signals at an adjustable modulation frequency for respective switch control terminals of a first output driver. A controller of the class D audio amplifier is configured to control frequency response characteristics of the adjustable loop filter based on a frequency setting of the adjustable modulation frequency.

BACKGROUND OF THE INVENTION

Class D audio amplifiers are a well-known type of audio power amplifier which is generally recognized to provide energy efficient audio drive of a loudspeaker load by switching a pulse width modulated (PWM) or pulse density modulated (PDM) signal across the loudspeaker load. Class D audio amplifiers typically comprises an H-bridge driver with a pair of output terminals coupled to respective sides or terminals of the loudspeaker load to apply an oppositely phased pulse width modulated or pulse density modulated audio signals across the loudspeaker. Several modulation schemes for pulse width modulated audio signals have been utilized in prior art PWM based class D amplifiers. In so-called AD modulation, the pulse width modulated audio signal at each output terminal or node of the H-bridge is switched between, or toggles between, two different levels in opposite phase. The two different levels typically correspond to the upper and lower power supply rails, respectively, such as the positive and negative DC supply rails of the class D amplifier. In so-called BD modulation, the pulse width modulated signal across the loudspeaker load is alternatingly switched between three levels of which two levels correspond to the above-mentioned upper and lower DC power supply rails and the third level is zero level that is obtained by simultaneously pulling both terminals of the loudspeaker load to one of the DC power supply rails. In multi-level PWM modulation as described in the applicant's co-pending patent application PCT/EP2011/068873, a third supply voltage level, often a set to a mid-supply level between the positive and negative DC supply rails, is applied to output node(s) of the output driver such that for example a 3-level or 5-level pulse width modulated signal can be applied across the loudspeaker load by an appropriately configured output driver.

The present inventor has obtained significant performance improvements in Class D amplifiers by adjusting the modulation frequency of the pulse width modulator according to specific characteristics of the audio input signal. The modulation frequency adjustment is beneficial for several reasons such as reduced EMI emission, reduced power loss in output switching devices etc. However, frequency response characteristics of loop filters of class D audio amplifiers are ordinarily designed or selected such that the feedback loop remains just stable, within a required safety margin due to component spread and production spread, at full output power and maximum setting of the modulation frequency. This loop filter design is advantageous in order to suppress distortion and noise generating mechanisms introduced by non-ideal behaviour of circuitry and components of the class D amplifier within the feedback loop. However, the just stable design of the loop filter at the maximum setting of the adjustable modulation implies the feedback loop tends to become unstable if a lower modulation frequency than the maximum frequency setting is chosen. Such a lower modulation frequency would otherwise be advantageous for example to save power as described above. Hence, it is advantageous to tailor or adapt the frequency response characteristics of the adjustable loop filter to a current setting of the modulation frequency, and optionally load power level, to obtain the highest possible loop gain of the feedback loop throughout the audio bandwidth (20 Hz-20 kHz) within loop stability constraints for specific settings of the modulation frequency of the pulse width modulator.

Accordingly, class D audio amplifiers with reduced levels of EMI noise are highly desirable. Likewise, class D amplifiers with improved power efficiency, especially at low or small audio input signals levels, are also highly advantageous. Finally, it is desirable to decrease the size of the external load inductors and load capacitors to provide more compact, power efficient, reliable and less costly Class D amplification solutions for consumer and other types of audio products.

SUMMARY OF INVENTION

A first aspect of the invention relates to a class D audio amplifier comprising:

- a first output driver comprising a first output node connectable to a loudspeaker load to supply a load signal thereto The first output driver comprises an upper leg having one or more semiconductor switches coupled between a first supply voltage and the first output node and a lower leg having one or more semiconductor switches coupled between the first output node and a second supply voltage, wherein each of the semiconductor switches comprises a switch control terminal adapted to control a state of the semiconductor switch to selectively place the semiconductor switch in its on-state or off-state. The class D audio amplifier A further comprises a pulse width modulator for receipt of a filtered audio signal and generation of a first set of pulse width modulated control signals at an adjustable modulation frequency for respective switch control terminals of the first output driver,
- a feedback loop comprising an adjustable loop filter and a summing node coupled to an audio input signal and a feedback signal derived from the load signal.

The feedback loop being configured to couple the feedback signal to the summing node. A controller is configured to control frequency response characteristics of the adjustable loop filter based on a frequency setting of the adjustable modulation frequency of the first set of pulse width modulated control signals.

The controller may comprise a Digital Signal Processor (DSP) for example comprising a software programmable DSP or a hardwired customized DSP for example a digital state machine integrated on an ASIC. In other embodiments the controller may comprise appropriately configured Field Programmable Logic Array (FPGA). If the controller comprises the software programmable DSP, a non-volatile memory space located within an EEPROM or flash-memory device may comprise appropriate program instructions or routines to generate the respective pulse width modulated control signals for the plurality of semiconductor switches as well as other functions. The individual control signals of the first set of pulse width modulated control signals for the semiconductor switches may be generated by a suitable DSP program or algorithm and applied directly to the individual semiconductor switches. In other embodiments, the first set of pulse width modulated control signals may be coupled to through a gate or pre-driver circuit, to raise amplitude levels of the control signals to an appropriate level for the plurality of semiconductor switches. In a number of applications, the gate driver circuit may comprise a pulse width modulated signal with a modulation frequency between 150 kHz and 5 MHz. In this embodiment, the first driver output may be adapted to apply a PWM modulated load signal from the class D audio amplifier to the loudspeaker load. Generally, the modulation frequency of the first set of pulse width modulated control signals preferably lies between 150 kHz and 5 MHz even more preferably between 500 kHz and 1 MHz.

The skilled person will understand that each frequency setting of the adjustable modulation frequency corresponds to a particular effective switching frequency depending on the type of pulse width modulation applied in the particular embodiment of the present class D audio amplifier. The effective switching frequency is equal to the adjustable modulation frequency for class AD modulation. The effective switching frequency is equal to two times the adjustable modulation frequency for class BD modulation. Likewise, for 3-level modulation of the load signal, the modulation frequency is equal to two times the adjustable modulation frequency and for 5-level modulation equal to 4 (four) times the adjustable modulation frequency etc. Generally, the effective switching frequency equals the number of PWM phases of the selected type of pulse width modulation multiplied with the adjustable modulation frequency.

The first and second supply voltages may comprise first and second DC supply voltages or power rail voltages of the class D audio amplifier. The second supply voltage may be a ground voltage, GND, of the class-D amplifier or a negative supply voltage for example substantially equal in magnitude to the first supply voltage. The first output driver may be adapted to operate across a wide range of the predetermined supply voltages depending on requirements of particular applications. In a range of useful applications, the difference between the first and second DC supply voltages which is the effective DC supply of the class D audio amplifier may be set to value between 5 Volt and 120 Volt. The DC supply voltage difference may be provided as a unipolar or bipolar DC voltage for example +5 Volt and GND or +/−2.5 Volt relative to a ground reference, GND.

In one embodiment of the present invention, the controller operates according to a master clock signal generated by a master clock generator. The master clock signal may be significantly higher than the selected modulation frequency setting of the pulse width modulated control signals such as between 10 and 100 times higher. The first set of modulated control signals or control signals for the respective semiconductor switches may be operated synchronously to the master clock signal. In one such embodiment, the class D audio amplifier comprises a sampling device such as an A/D converter configured to convert a filtered audio signal generated at an output of the adjustable loop filter to a corresponding digital audio signal for application to a digital pulse width modulator. The digital pulse width modulator may be adapted accept the filtered digital audio signal directly or the digital pulse width modulator may perform time-domain quantization of the digital audio signal to match a resolution of the digital audio signal to a resolution of the digital pulse width modulator. However, the noise shaping operation of the feedback loop will suppress any quantization noise generated by this process within the audio bandwidth as explained in further detail below in connection with FIG. 6 depicting an error transfer function of the feedback loop.

The controller is configured to control frequency response characteristics of the adjustable loop filter based on the frequency setting of the adjustable modulation frequency in accordance with the present invention. This is advantageous for various reasons as summarized in the following section. The frequency response characteristics of the loop filter is typically designed or selected such that the feedback loop of the class D amplifier remains just stable, within a required safety margin due to component spread and production spread, at the maximum setting of the adjustable modulation frequency. This loop filter design is advantageous in order to suppress distortion and noise generating mechanisms introduced by non-ideal behaviour of circuitry and components of the class D amplifier within the feedback loop. These distortion and noise generating mechanisms are complex and may be attributed to a variety of error sources such as timing errors in power transistors of the output driver, aliasing errors due to non-ideal frequency response of the feedback path and re-quantization errors etc. In general, output driver timing errors and aliasing errors tend to increase with increasing load on the class D amplifier or with increasing output power level of the class D amplifier. Error power induced by time quantization errors is proportional to the switching frequency or modulation frequency for a given digital sampling frequency. Therefore, the need for suppression of these types of errors and noise is most pronounced at the highest load power levels and at higher modulation frequencies e.g. at or close to the maximum setting of the adjustable modulation frequency. At smaller load power levels and at lower modulation frequencies it is often fully acceptable to set the frequency response characteristics of the adjustable loop filter such that less aggressive error and noise suppression is performed, i.e. expressed as a smaller magnitude of an error transfer function of the feedback loop within the audio bandwidth. However, the just stable design of the loop filter at the maximum setting of the adjustable modulation frequency together with the high load power level imply that the feedback loop inherently tends to become unstable when the controller selects a lower frequency setting than the maximum setting of the modulation frequency. This phenomenon is caused by the stable bandwidth of the feedback loop is limited to a certain fraction ($1/\pi$ for dual-edge naturally sampled PWM) of the modulation frequency. Hence, it is advantageous to tailor the frequency response characteristics of the adjustable loop filter to the actual or current setting of the modulation frequency, and optionally the load power level, to reach the highest possible loop gain in the audio bandwidth within loop stability constraints or bounds. This dynamic or adaptive adjustment of the frequency response characteristics of the loop filter leads to superior suppression of the above-mentioned error and noise mechanisms in the Class D audio amplifier at both the maximum and minimum frequency settings of the adjustable modulation frequency. In addition, any intermediate frequency setting(s) of the adjustable modulation frequency may be associated with a specifically tailored setting of the frequency response characteristics of the loop filter.

Consequently, according to an advantageous embodiment the controller is configured to select a higher order of the adjustable loop filter for the maximum frequency setting of the adjustable modulation frequency than for the minimum frequency setting of the adjustable modulation frequency. The maximum frequency setting of the adjustable modulation frequency is preferably situated between at or below 5 MHz as previously mentioned. The corresponding minimum frequency setting of the adjustable modulation frequency may lie between one-half and one-fourth of the selected maximum frequency and preferably above 150 kHz.

The current load power level may be detected by the controller in various ways and an appropriate frequency setting of the adjustable modulation frequency selected in response. In one such embodiment, the controller comprises an audio signal level detector. The controller is adapted to control the adjustable modulation frequency of the first set of modulated control signals, and optionally a second set of modulated control signals for a second output driver as described below in connection with H-bridge types of output drivers, in dependence of a detected level of the audio input signal. The level of the audio input signal may be detected in a direct way or indirectly. The level of the audio input signal may be indirectly detected by detecting or analysing a modulation duty cycle or modulation index of the pulse width modulated control signals or the modulation index of the load signal. The skilled person will understand that the level of the audio input signal can be represented in numerous ways for example by its peak-voltage, average voltage, RMS voltage etc.

The adjustable loop filter may comprise a continuous time frequency selective filter or a switched capacitor type (time-discrete) frequency selective filter. According to a preferred embodiment, the adjustable loop filter comprises a low-pass filter inserted in a forward signal path of the feedback loop, for example between an output signal of the summing node, normally referred to as an error signal, and an input of the pulse width modulator such that the loop filter generates the filtered audio signal for the pulse width modulator. In another embodiment, the adjustable loop filter comprises a high-pass filter inserted in a reverse signal path of the feedback loop running from the load signal to the summing node. The skilled person will understand that the summing node may be configured to add or subtract the feedback signal and the audio input signal depending on their respective phases to generate the error signal. The low-pass filter may comprise a plurality of cascaded integrators comprising respective integrator time constants and respective integrator gain coefficients. A cut-off frequency and an order of the low-pass filter may be set by appropriate selection of the number of cascaded integrators and associated integrator time constants. In a preferred embodiment of the low-pass filter, one or more of the cascaded integrators comprises output level clamping to limit maximum output level of the integrator such as a maximum output voltage level or a maximum output current level. The output level clamping is preferably applied to one or more front-end integrator(s) in the chain of cascaded integrators because reduction of the output signal(s) of these integrator(s) is most effective to reduce recovery time of the loop filter from a saturated condition and hence to restore normal operation of the class D audio amplifier.

The output level clamping reduces a maximum output peak-peak signal voltage or peak-peak signal current of the clamped integrator(s) relative to a maximum output peak-peak signal voltage or peak-peak signal output current of the unclamped integrator(s). In one embodiment, the maximum output peak-peak signal voltage of the clamped integrator(s) is less than one-half, preferably less than one-third, of the unclamped integrator(s). The controller may be adapted to adjust the frequency response characteristics of the adjustable loop filter in numerous ways. In one preferred embodiment, the controller is configured to change an order of the adjustable loop filter based on the setting of the adjustable modulation frequency. The order of the loop filter may be changed or switched from a first pre-set order between 2 and 8, for example fourth order, to second pre-set order one or two orders smaller than the first pre-set order. In another embodiment, the controller is configured to adjust the respective integrator time constants of the plurality of integrators with a common scaling factor, such as a scaling factor between 0.25 and 4, to control the frequency response characteristics of the adjustable loop filter. In the latter embodiment, the order and slope-characteristics of the loop filter remain constant, but an open loop bandwidth of the feedback loop is changed. In yet another embodiment, the frequency response characteristics of the adjustable loop filter are adjusted by the controller by scaling the respective gain coefficients of the plurality of integrators with a plurality of scaling coefficients to control the frequency response characteristics of the adjustable loop filter. The scaling coefficients may differ in accordance with a scaling factor rule such that scaling coefficient (N)=(scaling factor)$^N$ where N is an integrator index starting with one at the input of the loop filter. The scaling factor could e.g. be set to 0.5 resulting in a series of scaling coefficients: 0.0625, 0.125, 0.25 and 0.5 for a fourth order loop filter.

The open loop bandwidth of the feedback loop is preferably set to a value between 0.01 and 1.0 times, preferably between 0.1 and 0.5 times, the effective switching frequency. In the present context, the open loop bandwidth is defined as the frequency of 0 dB gain of the open loop magnitude response.

According to a number of advantageous embodiments of the present Class D audio amplifier, the first output driver is configured to generate a multi-level load signal to the loudspeaker load. Each of these embodiments comprises a DC voltage source configured to set a third supply voltage at the first output node, such as a mid-point voltage, to provide a first tri-level load signal across the loudspeaker load. In one such embodiment, the DC voltage source comprises a so-called flying capacitor charged to the third supply voltage. In the latter embodiment of the present class D audio amplifier, the upper leg of the first driver comprises a first and a second semiconductor switch coupled in cascade and the lower leg of the first driver comprises a third and fourth semiconductor switch coupled in cascade; The DC voltage source comprises a capacitor (above-mentioned flying capacitor) charged to the third supply voltage and coupled between a first node, located between the first and second cascaded semiconductor switches, and a second node, located between the third and fourth cascaded semiconductor switches. The first set of pulse width modulated control signals being configured to:

- in a first state, connecting a first terminal of the capacitor to the first output node through the first and third semiconductor switches,
- in a second state, connecting a second terminal of the capacitor to the first output node through the fourth and second semiconductor switches. It is a significant advantage of the latter embodiment that the DC voltage difference between the first and second supply voltages is divided between the at least two cascaded or series coupled semiconductor switches of the upper leg or the lower leg. The cascaded semiconductor switches reduce breakdown voltage requirements of the individual semiconductor switches.

According to other multi-level embodiments of the present class D audio amplifier, the third supply voltage setting at the first output node is derived from a DC voltage at a mid-point or tapping point of a resistor or capacitor network coupled between the first supply voltage and the second supply voltage. A significant advantage of the multi-level embodiments of the class D audio amplifier over classic AD and BD pulse width modulation is suppression or attenuation of common mode ripple voltage across the loudspeaker load and output filter components. This common mode ripple voltage is an unwanted residue of the switching or modulation frequency of the pulse width modulated carrier. Another advantage is a lower output filter inductor ripple current and output filter capacitor ripple voltage at small modulation duty cycles corresponding to small levels of the audio input signal.

The DC voltage source may comprise at least one component selected from a group of {a charged capacitor, a floating DC supply rail, a battery}. In preferred embodiments based on flying capacitor(s), each flying capacitor may have a capacitance between 100 nF and 10 μF. Since the DC voltage source(s) is required only to deliver a small amount of energy during operation of the class D audio amplifier, and linearity requirements are relaxed, capacitors of limited capacitance and physical size can be used as flying capacitors.

A number of advantageous embodiments are based on an H-bridge output driver comprising a second output driver, preferably largely identical, to the first output driver in topology. The loudspeaker load is coupled between the first output node and a second output node of the second output driver such that a differential or balanced load signal is applied to the loudspeaker load. Consequently, there is provided a class D audio amplifier further comprising:

- a second output driver comprising a second output node connectable to the loudspeaker load to supply the balanced load signal thereto,
- said second output driver comprising an upper leg having one or more semiconductor switches coupled between the first supply voltage and the second output node and a lower leg having one or more semiconductor switches coupled between the second output node and the second supply voltage,
- wherein each of the semiconductor switches of the second output driver comprises a switch control terminal adapted to control a state of the semiconductor switch to selectively place the semiconductor switch in its on-state or off-state;
- the controller being further adapted to generate a second set of pulse width modulated control signals at the adjustable modulation frequency for respective switch control terminals of the second driver.

The second output driver may of course include any individual feature or any combination of the individual features described in connection with the above-described embodiments of the first output driver.

When the present class D audio amplifier comprises an H-bridge output driver, it may be adapted to provide different numbers of output levels dependent on a phase relationship between corresponding pulse width modulated control signals of the first output driver and the second output driver such that two or more distinct operation modes utilizing different number of levels of the multi-level balanced load signal. In these embodiments, the controller is preferably configured to:

- in the first operation mode, providing each control signal of the second set of modulated control signals with opposite phase relative to a corresponding control signal of the first set of modulated control signals to generate a 3-level balanced load signal,
- in the second operation mode, providing each control signal of the second set of modulated control signals with opposite phase and an additional +/−90 degrees phase shift relative to the corresponding control signal of the first set of modulated control signals to generate a 5-level balanced load signal.

According to an advantageous embodiment the controller comprises the previously described audio signal level detector such that the controller may be configured to switch between the first operation mode and the second operation mode in dependence of the detected level of the audio input signal such that switching between the 5-level and 3-level balanced load signals is controlled based on the level of the audio input signal. The controller may be further configured to control the modulation frequency of the first set and/or second set of modulated control signals as well based on the level of the audio input signal. This is accomplished according to a preferred embodiment by adapting the controller to comparing the detected level of the audio input signal with a predetermined level threshold. The controller being adapted to set a first modulation frequency of the first set and/or second set of modulated control signals when the detected audio signal level is smaller than the predetermined level threshold and set a second modulation frequency of the first set and/or second set of modulated control signals when the detected audio signal level is larger than the predetermined level threshold. The first modulation frequency is lower than the second modulation frequency.

The audio input signal and feedback signals are preferably analog signals and the summing node configured to subtract or add these signals in the analog domain to provide the error or difference signal in analog format to the loop filter. However, the pulse width modulator may generally be implemented as an analog or a digital pulse width modulator. The digital pulse width modulator requires a clock signal and the filtered audio signal to be provided in digital format. Hence, the feedback loop may comprise a sampling device such as an A/D converter, preferably a flash A/D converter having a resolution of 5-10 bits, for receipt and conversion of the filtered audio signal to a corresponding digital or sampled filtered audio signal. The sampling device is operating in accordance with a sampling clock signal to generate the digital filtered audio signal to the digital pulse width modulator. The sampling clock signal may be derived from a clock signal of the controller in synchronous format. The digital pulse width modulator is configured to generate a uniformly sampled pulse width modulated audio signal in accordance with the sampling clock signal. Finally, in this embodiment, the controller is preferably adapted to generating the first set and/or second set of pulse width modulated control signals based on the uniformly sampled pulse width modulated audio signal. Quantization noise generated by the sampling device is suppressed by the operation, i.e. magnitude of an error transfer function (ETF), of the feedback loop. The sampling device could alternatively be placed in front of the loop filter, at the output of the summing node, and the loop filter implemented as a digital low-pass filter directly accepting a digitized output signal from the summing node.

The first and second output drivers may utilize numerous types of semiconductor switches depending on requirements of any particular application for example depending on low voltage or high voltage applications. Each of the semiconductor switches of the output drivers preferably comprises one, or several parallelly coupled, transistors selected from a group of {Field Effect Transistors (FETs), bipolar Transistors (BJTs), Insulated Gate Bipolar Transistors (IGBTs)}.

The one or more semiconductor switches of the first output driver and the one or more semiconductor switches of the second output driver preferably comprise respective CMOS transistor switches such as NMOS transistors. The entire class D audio amplifier is preferably integrated on a CMOS or BCD semiconductor die or substrate to provide a robust and low-cost single chip solution which is particularly well-suited for high-volume consumer oriented audio applications, such as TV sets, mobile phones and MP3 players, where cost is an essential parameter. In the on-state or ON, the semiconductor switch preferably exhibits a low resistance, such as less than 10Ω, or more preferably less than 1Ω, between a pair of controlled switch terminals, such as drain and source terminals of a MOS transistor. In the off-state or OFF, the semiconductor switch preferably exhibits a large resistance, such as above 1 MΩ or several MΩ, between the pair of controlled terminals. The on-resistance of a semiconductor device is generally determined by its process of manufacture and its geometry. For semiconductor switches implemented as CMOS transistors the relevant geometrical parameter is the width-to-length (W/L) ratio of the CMOS transistor. PMOS transistors of CMOS semiconductor processes generally exhibit an on-resistance which is 2-3 times larger than an on-resistance of a NMOS transistor with similar dimensions and manufactured in the same semiconductor process. Generally, the on-resistance of each of the semiconductor switches preferably lies between 0.01Ω and 10Ω.

The respective amplitudes or levels of the modulated control signals such as each control signal of the first and second sets of pulse width modulated control signals are preferably sufficiently large to selectively place the semiconductor switch in question in either an on-state/closed state or an off-state/open state. In some embodiments, the first and second output drivers may comprise one or more level converters configured to raise respective amplitudes of the modulated control signals from a first level to a second level which is higher or larger than the first level. The second level is preferably sufficiently high to drive each of the semiconductor switches into its on-state when needed. The first and second output drivers may be adapted to operate across a wide range of supply voltages, i.e. the DC supply voltage difference between the first and second supply voltages, depending on requirements of a particular application. The first supply voltage may be a positive DC supply voltage and the second supply voltage may be a negative DC supply voltage or a ground reference. In a range of useful applications, the supply voltage difference may be set to a DC voltage between 5 Volt and 120 Volt.

A second aspect of the invention relates to a sound reproducing assembly comprising a class D audio amplifier according to any of the above-described aspects and embodiments thereof, and a loudspeaker load operatively coupled to the output node of the first driver and one of the first and second supply voltages. The second supply voltage may be GND. Alternatively, the sound reproducing assembly may comprise H-bridge based class D audio amplifiers having first and second output drivers as outlined above where the loudspeaker load is operatively coupled in-between respective output nodes of the first and second output drivers. The loudspeaker load may comprise any type of moving coil (dynamic), moving armature, piezoelectric, electrostatic type of audio speaker. The sound reproducing assembly is preferably shaped sized for integration with stationary or portable entertainment products such as TV sets, computers, Hi-Fi equipment etc.

The sound reproducing assembly may further comprise a load inductor coupled between the output node of the first driver and the loudspeaker load and a load capacitor coupled between the loudspeaker load and one of the first and second DC supply voltages. The load inductor and capacitor form in combination a lowpass filter to suppress high frequency components associated with the switching frequency of the pulse width or pulse density modulated output signals at the output node or output nodes. A cut-off frequency of this lowpass filter may be above the audio band such as between 20 kHz and 100 kHz by appropriate choice of component values of the load inductor and capacitor.

BRIEF DESCRIPTION OF THE DRAWINGS

A preferred embodiment of the invention will be described in more detail in connection with the appended drawings, in which.

DETAILED DESCRIPTION OF PREFERRED EMBODIMENTS

Figure 1:
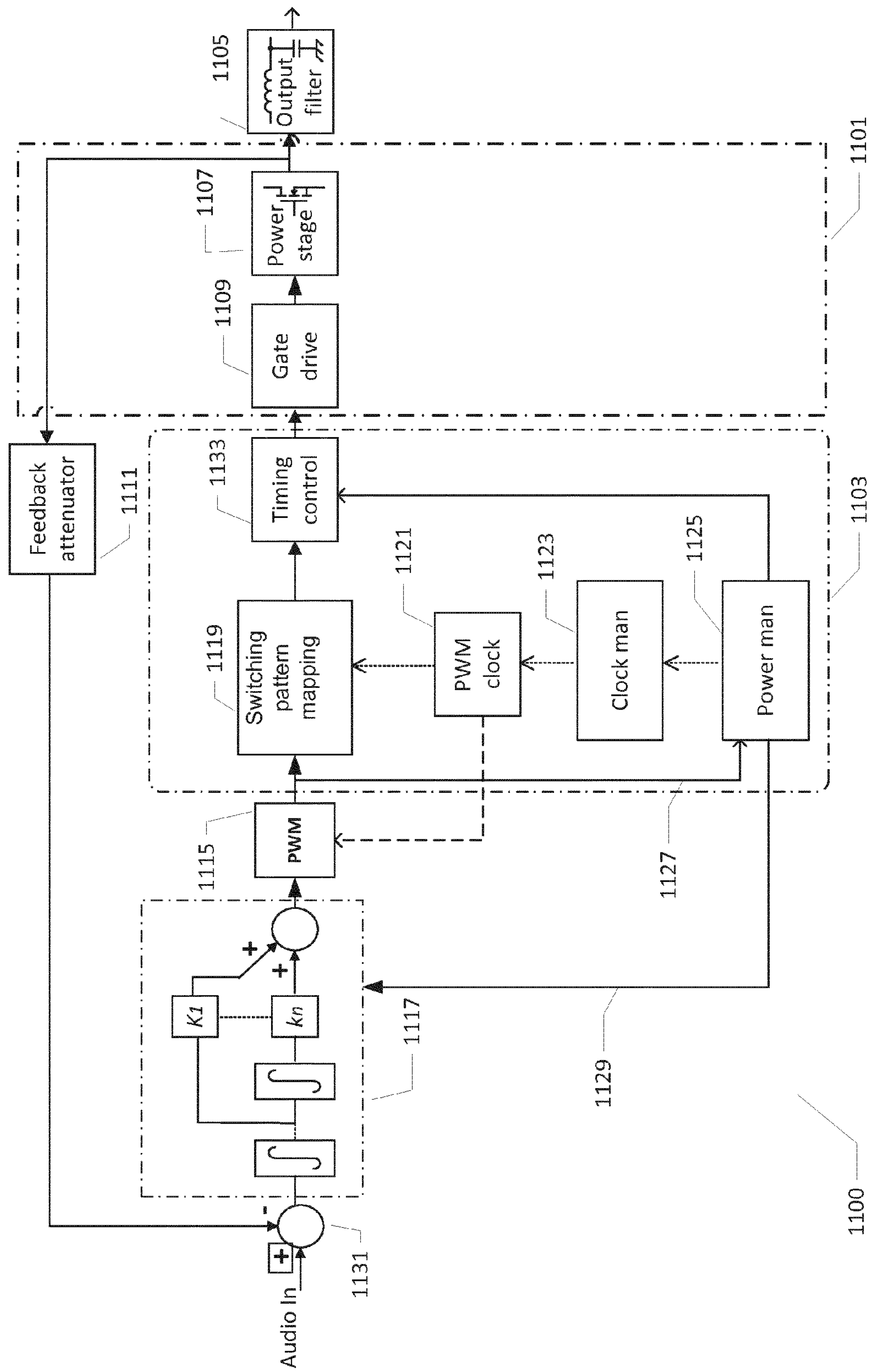
FIG. 1 illustrates schematically a class D audio amplifier with feedback loop comprising a loop filter with adjustable frequency response characteristics in accordance with a preferred embodiment of the invention.
Figure 12:
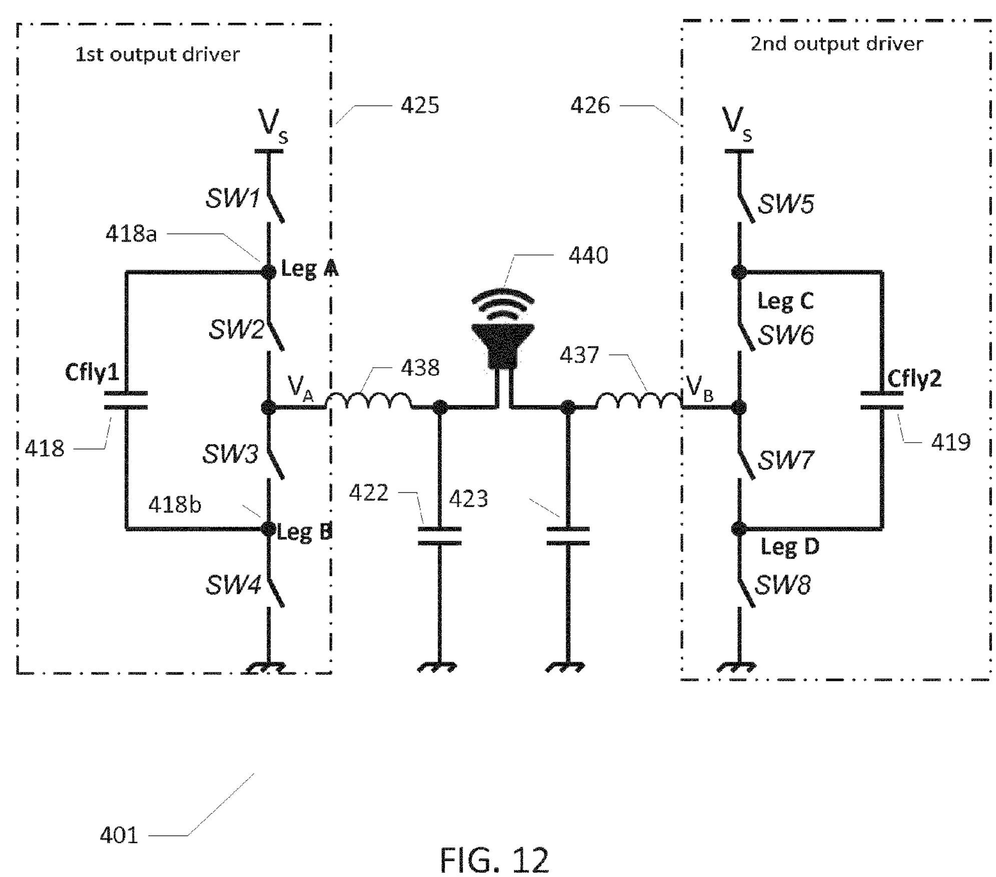
FIG. 12 shows a schematic diagram of an H-bridge output driver coupled to loudspeaker loads utilizing a switchable multi-level modulation scheme in accordance with a third embodiment of the output driver.

FIG. 1 schematically illustrates a PWM based class D audio amplifier 1100 comprising a balanced/differential or H-bridge driver 1101, for example similar to a multi-level H-bridge output driver 401 depicted on FIG. 12, coupled to a controller 1103 in accordance with a preferred embodiment of the invention. The present class D audio amplifier 1100 utilizes a sophisticated modulation frequency dependent switching between different frequency response characteristics of an adjustable loop filter 1117 of a feedback loop or path of the class D amplifier 1100 as explained in detail below. The schematically illustrated H-bridge driver 1101 comprises a gate drive circuit 1109 that increases signal amplitudes of respective pulse width modulated control signals for eight semiconductor switches of a balanced output driver 1107 to a level that allows the individual semiconductor switches to be appropriately placed in ON and OFF states. The gate drive circuit 1109 may comprises various types of level converters. The amplitude of each of the pulse width modulated switch control signals may be around 1.8 Volt, 3.3 Volt or 5 Volt when supplied from a normal CMOS integrated circuit comprising the controller 1103. If the DC supply voltage of the H-bridge driver for example is set to about 40 Volts, the amplitudes of the pulse width modulated control signals are raised to about 40 Volts, or more, by the gate drive circuit 1109 as well. The H-bridge output driver 1101 is preferably identical to the H-bridge output driver 401 depicted on FIG. 12 as mentioned before. However, different types of single-ended or balanced (H-bridge) output drivers may be used in the alternative with good results provided the controller is re-configured to supply appropriate pulse width modulated control signals to individual semiconductor switches of the output driver type in question. Electrical characteristics of the output filter circuit 1105 are preferably also similar to the output filter coupled to the H-bridge output driver 401. The output filter circuit 1105 accordingly comprises a load inductor and load capacitor coupled to each of first and second output nodes of the H-bridge output driver 1101.

The controller 1103 may comprise a Digital Signal Processor (DSP) either in software programmable configuration or as dedicated hardware, for example comprising a digital state machine, configured to provide the below described functions or operations in accordance with a set of executable program instructions or hardwired states. The class D audio amplifier 1100 further comprises an analog summing node 1131 arranged in front of an adjustable loop filter 1117 for receipt of analog audio input signals at the Audio In node. A feedback signal derived from the first and/or second output nodes of the H-bridge output driver, prior to the output filter circuit 1105, is coupled to the summing node 1131 via a feedback attenuator 1111. The load feedback signal is subtracted from the analog audio input signal by the summing node 1131 to form an error signal or difference signal that is applied to an input of the adjustable loop filter 1117. The error signal is applied to the input of the adjustable loop filter 1117 which accordingly may be implemented as an analog circuit in the present embodiment of invention. The adjustable loop filter 1117 comprises four cascaded integrators, as described in further detail in connection with FIGS. 3 and 4 below, in the present embodiment of the invention. The skilled person will understand that alternative embodiments of the loop filter may use fewer or more cascaded integrators or other types of low-pass filters. The integrators are schematically illustrated in FIG. 1 by integrator symbols and respective gain coefficients, $k_1$-$k_n$, that are operative to lowpass filters the resulting audio input signal before transmission to an analog pulse width modulator circuit 1115 or PWM circuit. The skilled person will appreciate that the PWM circuit 1115 may be replaced with a digital PWM circuit provided that the output signal of the adjustable loop filter 1117 is digitized for example by a flash or sigma-delta A/D converter.

Figure 15:
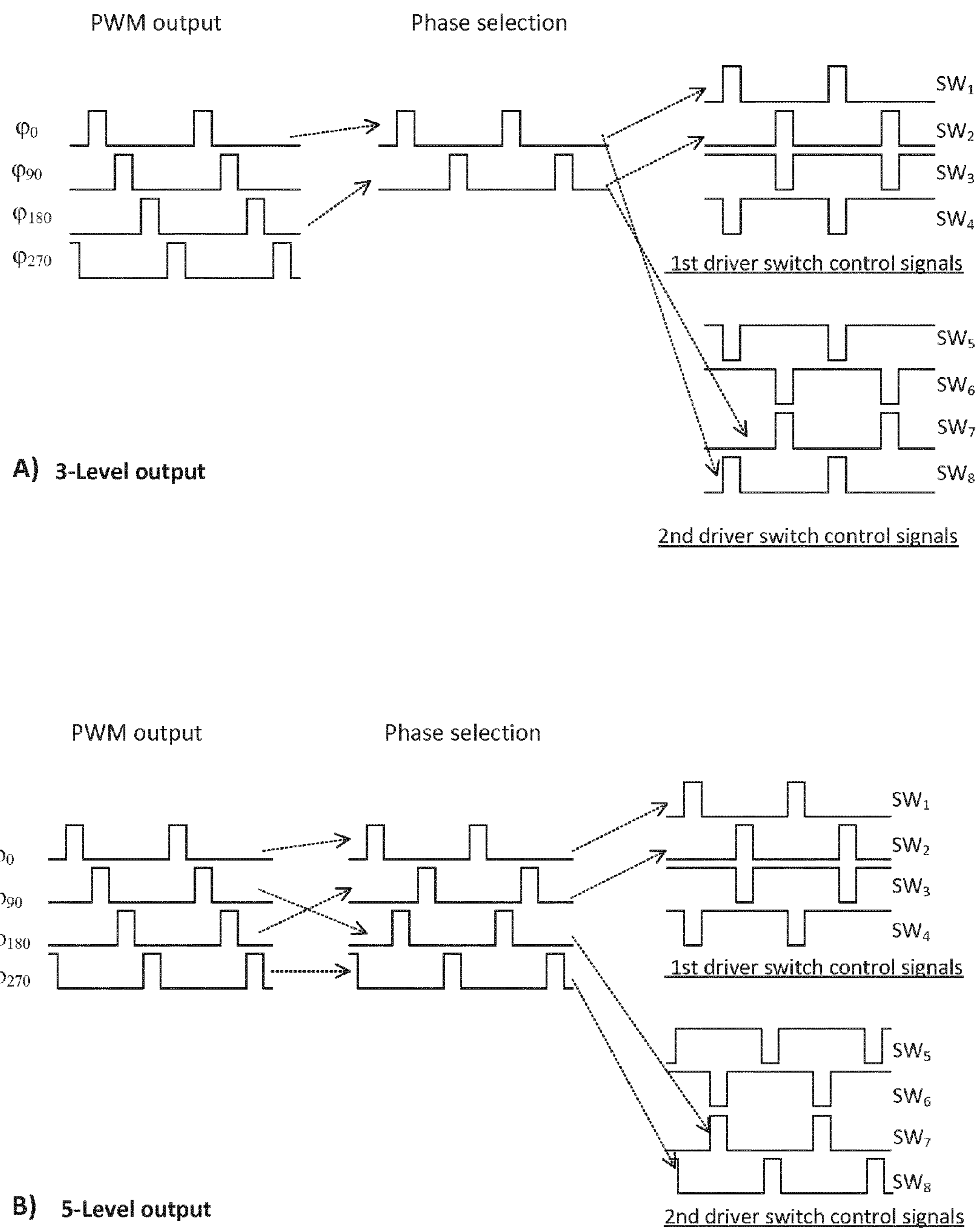

The modulation or carrier frequency of the PWM circuit 1115 is controlled by a PWM clock circuit 1121, arranged within the controller 1103, which generates synchronization pulses to the PWM circuit 1115. The PWM circuit 1115 produces a naturally sampled pulse width modulated audio signal with a modulation frequency set or controlled by the PWM clock circuit 1121. The naturally sampled pulse width modulated audio signal is conveyed to a switching pattern mapping circuit 1119. The switching pattern mapping circuit 1119 is configured to generate an appropriately phased and timed pulse width modulated control signal for each of the eight semiconductor switches of the power stage 1107 as explained below in connection with FIGS. 15A) and 15A). In the present embodiment of the invention, where each of the first and second output drives of the H-bridge output driver 1101 comprises four stacked semiconductor switches, the output of the switching pattern mapping circuit 1119 comprises eight pulse width modulated control signals which are conveyed to an optional timing controller 1133. The timing controller 1133 may be adapted to perform certain time base adjustments to one or more of the eight pulse width modulated control signal for example dead-time control between certain pairs of control signals to ensure non-overlap of the same control signals. The eight time-base adjusted pulse width modulated control signals are thereafter transmitted to the gate drive 1109 as described above. In the present embodiment, the switching pattern mapping circuit 1119 operates entirely in the analog domain such that each of pulse width modulated control signals for the respective eight semiconductor switches of the power stage 1107 is a naturally sampled pulse width modulated audio signal. The switching pattern mapping circuit 1119 is configured to generate pulse width modulated switch control signals with appropriate timing and polarity to the eight individual semiconductor switches (SW1-SW8) of the H-bridge output driver 1101 as described below in connection with FIG. 12) and FIGS. 15*a*) and 15*b*). The modulation or carrier frequency of each of the pulse width modulated control signals is set by the PWM clock generator 1121 operating in accordance with a clock frequency control signal set by the clock management circuit 1123 such that the class D amplifier is provided with an adjustable PWM modulation frequency as mentioned above. A power management circuit 1125 comprises a modulation sensing input port 1127 allowing the power management circuit 1125 to detect a modulation duty cycle of the pulse width modulated audio signal supplied to the input of the switching pattern mapping circuit 1119. Since the detected modulation duty cycle indicates an instantaneous level of the resulting audio input signal, the power management module exploits this audio level information to control the frequency setting of the adjustable modulation frequency of the pulse width modulated control signals or switch control signals applied to the H-bridge output driver 1101. In the present embodiment, the adjustable modulation frequency is switched between three different pre-set settings of 150 kHz, 300 kHz and 600 kHz for high levels, medium levels and low levels, respectively, of the audio input signal. The skilled person will understand that the controller 1103 may be configured to use additional pre-set modulation frequency settings in other embodiments of the invention. Furthermore, the specific frequency settings of the adjustable modulation frequency may vary widely depending on a particular application. The maximum setting of the adjustable modulation frequency may lie between 300 kHz and 5 MHz in a number of useful embodiments. In the present embodiment, the controller 1103 is configured to control frequency response characteristics of the adjustable loop filter 1117 based on the frequency setting of the adjustable modulation frequency. The power management circuit 1125 of the controller alter frequency response characteristics of the loop filter 1117 via filter control line or bus 1129 in an adaptive manner depending on the selected setting of the adjustable modulation frequency. According to one embodiment, the order of the loop filter is changed or switched for example between a fourth order low-pass filter and a third or second order low-pass filter. In another embodiment, respective integrator time constants of one or more of the integrators (items 310, 1303, 1305, 1307 of FIG. 4) is changed or switched such that the order of the loop filter remains unchanged but a cut-off frequency is raised or lowered e.g. with a factor between 0.25 and 4. This is explained in further details below in connection with the description of the detailed loop filter schematic of FIG. 3. The adjustable frequency response characteristics of the loop filter 1117 entails a number of advantages as described in the following.

The frequency response characteristics of the loop filter 1117 are typically designed such that the feedback loop is just stable, within a required safety margin due to component and production spread, at the maximum setting of the adjustable modulation frequency. This is advantageous in order to suppress distortion and noise generating mechanisms introduced by non-ideal behaviour of circuitry and components of the class D amplifier within the feedback loop. These distortion and noise generating mechanisms are generally complex and may comprise a variety of sources such as timing errors in power transistors of the output driver, aliasing errors due to non-ideal frequency response of the feedback path and re-quantization errors etc. Furthermore, time base quantization errors may be introduced in some embodiments of the invention where an analog PWM is utilized to generate the pulse width modulated control signals in conjunction with a synchronous (clocked) digital state machine for performing switching pattern mapping of the H-bridge output driver 1107 or other types of output drivers. In general, output driver timing errors and aliasing errors tend to increase with increasing load or output power level. The error power induced by time quantization errors is proportional to the switching frequency or modulation frequency for a given digital sampling frequency. Therefore, the need for suppression of these types of errors and noise is most pronounced at the highest load power levels and at higher modulation frequencies. At lower load power levels and at lower modulation frequencies, it is often fully acceptable to select the frequency response characteristics of the adjustable loop filter 1117 for less aggressive error and noise suppression.

The just stable design of the loop filter 1103 at the maximum setting of the modulation frequency and a high load power levels implies that the feedback loop inherently tends to become unstable when the controller 1103 selects a lower setting than the maximum setting of the modulation frequency. This happens because the stable bandwidth of the feedback loop is limited to a certain fraction ($1/\pi$ for dual-edge naturally sampled PWM) of the modulation frequency. Hence, it is advantageous to tailor the frequency response characteristics of the loop filter 1117 to the actual or current setting of the modulation frequency, and optionally load power level, such that the highest possible loop gain within the audio bandwidth is reached for the associated loop stability constraints or bounds. This dynamic or adaptive adjustment of the frequency response characteristics of the loop filter 1103 based on the setting of the modulation frequency leads to superior suppression of the above-mentioned error and noise mechanisms in the Class D amplifier at both the maximum and minimum frequency settings of the adjustable modulation frequency. In addition any intermediate frequency setting(s) of the adjustable modulation frequency may have a specifically tailored setting of the frequency response characteristics of the loop filter 1103.

Figure 3:
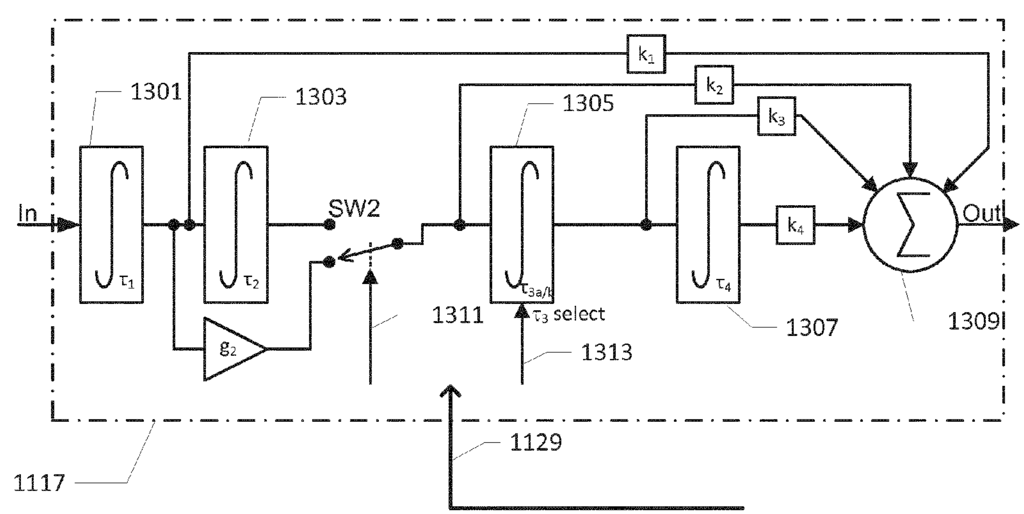
FIG. 3 is a simplified schematic diagram of an adjustable or adaptive loop filter for use in the feedback loop of the class D audio amplifier depicted on FIG. 1.

In one embodiment, the order of the loop filter is reduced by the controller to perform the adjustment of the frequency response characteristics of the loop filter 1103 when the adjustable modulation frequency is reduced. This maintains the stability of the feedback loop at the lower modulation frequency without considerably sacrificing the magnitude of the loop gain and without adjusting all integrator time constants. For a nominally 4th order loop filter to be reduced to a stable $3^{rd}$ order design (as illustrated in FIG. 3), it is hence only necessary to change three parameters. To scale the frequency response of the $4^{th}$ order loop filter by adjusting the integrator time constants would, on the other hand, require a total of four parameter changes.

The present embodiment, the power management circuit or module 1125 is further adapted to exploit the audio level information to select between a 3-level modulation mode and 5-level modulation mode for the balanced load signal at the output nodes of the H-bridge output driver 1107. The skilled person will understand that this feature is entirely optional and that the above-described dynamic or adaptive adjustment of the frequency response characteristics of the loop filter 1117 in dependence of the selected setting of the adjustable modulation frequency will function without such switching between 3-level and 5-level balanced load signal. In particular, the skilled person will appreciate that the above-described dynamic adjustment of the frequency response characteristics of the loop filter 1117 will function equally well with an output driver without multi-level capability such as the ordinary H-bridges configured for classic Class AD or BD modulation described in connection with FIGS. 9-11 below. The power management circuit 1125 is configured to switch between three distinct operational modes depending on the detected modulation duty cycle. Lower and upper modulation thresholds determine both the appropriate settings of the modulation frequency and the appropriate setting of the operation mode (3-level mode or 5-level mode in the present embodiment) such that a first or super-idle mode is entered when the detected modulation duty cycle is below the lower modulation threshold. This first modulation threshold may for example be set to a modulation index between 0.01 and 0.05 such as about 0.02. In the super-idle mode, the modulation frequency setting $f_{sw}$ may be about 150 KHz to provide an effective switching frequency of 600 kHz and the switch control signals are preferably configured to provide 5-level modulation by the switching pattern mapping circuit 1119. This operational mode is graphically depicted as super-idle mode 1203 in FIG. 2 where the horizontal arrow indicates increasing direction of the level of the audio input signal and thus increasing modulation duty cycle.

The power management circuit 1125 is configured to switch to a second or low-power mode 1205 (Refer to FIG. 2) once the detected modulation duty cycle exceeds the lower modulation threshold, but still lies below the upper modulation threshold. This second modulation threshold may for example be set to a modulation index between 0.05 and 0.2 such as about 0.1. In the low-power mode, the modulation frequency setting $f_{sw}$ is preferably increased relative to the super-idle mode because it allows a higher loop bandwidth of the feedback path so as to improve suppression of non-linarites in the H-bridge output driver of the power stage 1107. The modulation frequency setting of the low-power mode may be about twice the latter modulation frequency setting of the super idle mode. The controller is preferably configured to generate the switch control signals to maintain the existing 5-level modulation to maximize the loop bandwidth of the feedback path for a given setting of the modulation frequency $f_{sw}$ of the naturally sampled pulse width modulated audio signal. Finally, the power management circuit 1125 is configured to switch to a third or normal mode 1207 (Refer to FIG. 2) once the detected modulation duty cycle exceeds the upper modulation threshold. In the normal mode, the modulation frequency $f_{sw}$ is preferably increased by a predetermined amount such as by a factor between 1.5 and 4 relative to the modulation frequency of the low-power mode because of the change of operational mode in normal mode. This change would tend to reduce the loop bandwidth if the modulation frequency remained constant. However, the 3-level modulation of output signal across the loudspeaker load suppresses the common mode component of the load capacitor ripple voltage in an advantageous manner to improve EMI performance at large audio signal levels.

FIG. 3 is a simplified schematic diagram of the adjustable or adaptive loop filter 1117. The adjustable or adaptive loop filter 1117 comprises a cascade of four integrators, 1301, 1303, 1307 and 1307. The first integrator 1301 is coupled to receive an input signal which is the error or difference signal supplied at the output of summing node or junction 1131 after subtraction of the feedback signal from the audio input signal. The frequency response characteristics of the adjustable loop filter 1117 are controllable via the control line or bus 1129 as mentioned above. Each of the four integrators, 1301, 1303, 1307 and 1307 has an associated gain coefficient, $k_1$-$k_4$, and an associated integrator time constant, $\tau_1$-$\tau_4$, that in conjunction set a frequency response of each integrator. Output signals of the four integrators, 1301, 1303, 1307 and 1307 are summed or combined at summing junction 1309 to provide final loop filter output signal at terminal Out. The adjustable loop filter 1117 further comprises a bypass switch coupled across the second integrator 1303 such allowing the order of the loop filter to be altered between a $4^{th}$ order low-pass filter and a $3^{rd}$ order lowpass filter controlled by the control line or bus 1129. In addition, the control line or bus 1129 is operatively coupled to the integrator time constant $\tau_3$ of the $3^{rd}$ integrator allowing the latter to be adjusted under control of the controller 1103. The third integrator 1307 of the adjustable loop filter 1117 furthermore comprises a clamping circuit (not shown) limiting a maximum output voltage of this integrator as described in additional detail below.

Figure 4:
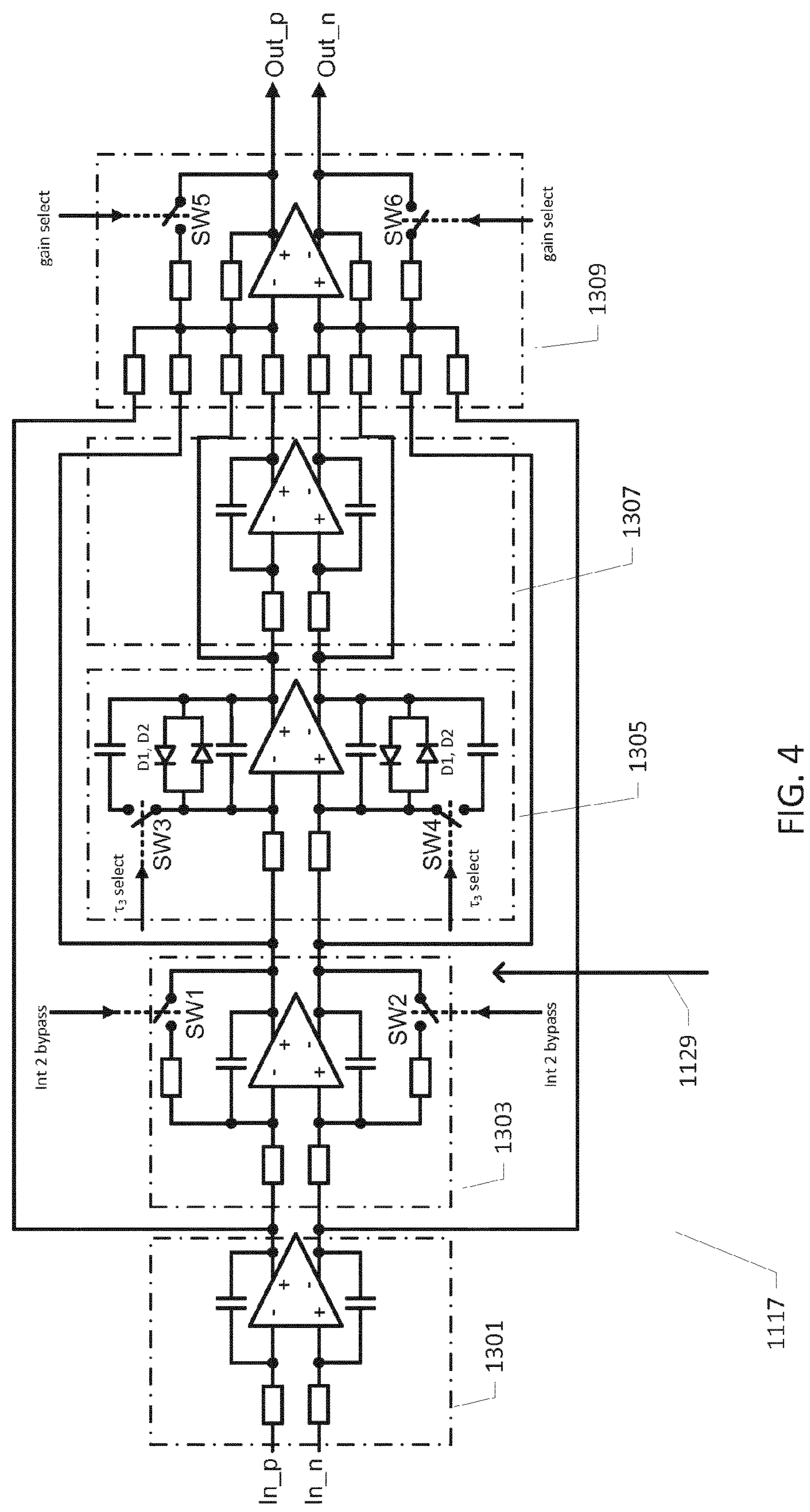
FIG. 4 is detailed circuit diagram of the adjustable or adaptive loop filter depicted on FIG. 3.

FIG. 4 is detailed circuit diagram of the adjustable loop filter 1117 depicted schematically on FIG. 3. The adjustable loop filter 1117 is based on balanced or differential circuitry to improve power supply noise rejection and enhance linearity and signal swing capability of the loop filter 1117. The resulting audio signal at the input of the first integrator 1301 is supplied as a differential signal to respective differential inputs of a first operational amplifier. The integrator time constant of the first integrator 1301 is determined by a combination of feedback capacitors and input resistors coupled to the first operational amplifier. The second integrator 1303 has an integrator time constant determined by a combination of feedback capacitors and input resistors in a similar manner tot the first integrator and similar to the $3^{rd}$ and fourth integrators 1307, 1309, respectively. However, the second integrator comprises a pair of bypass switches SW1, SW2 coupled across respective ones of the feedback capacitors to short-circuit the latter components in closed states of the pair of bypass switches. In this manner, the integrator functionality of the second integrator 1303 can selectively be eliminated, e.g. altered to a signal gain or attenuation function, in accordance with a control signal supplied through bus 1129. The pair of bypass switches SW1, SW2 may in practice be implemented in numerous ways for example as respective MOS transistor circuits controlled by suitably adapted gate control signals. The third integrator 1307 comprises a pair of identical output voltage clamping circuits each comprising semiconductor diodes D1, D2. The semiconductor diodes D1, D2 coupled in anti-parallel configuration between respective outputs and inputs of the two sides of the fully differential operational amplifier of the third integrator 1307. Each pair of the semiconductor diodes D1, D2 is limiting maximum output voltage or signal amplitude at the output of the operational amplifier to an output voltage which lies below an inherent output voltage capability of the operational amplifier. The previously mentioned adjustment of the integrator time constant $\tau_3$ of the $3^{rd}$ integrator is implemented by a pair of additional integrator capacitors that can be coupled in parallel to the integrator capacitors by respective semiconductor switches SW3, SW4. Hence, when the semiconductor switches SW3, SW4 are closed or on, the total integrator capacitance is increased to increase the integrator time constant $\tau_3$ and lower a cut-off frequency the third integrator 1307. Output signals of the four integrators, 1301, 1303, 1307 and 1307 are summed or combined in an analog summing circuit 1309 designed around a fully balanced operational amplifier generating the final loop filter output signal as a balanced signal, Out_p and Out_n. The analog summing circuit 1309 finally comprises an optional gain adjustment or setting function controlled by a pair of semiconductor switches SW5, SW6.

Figure 5:
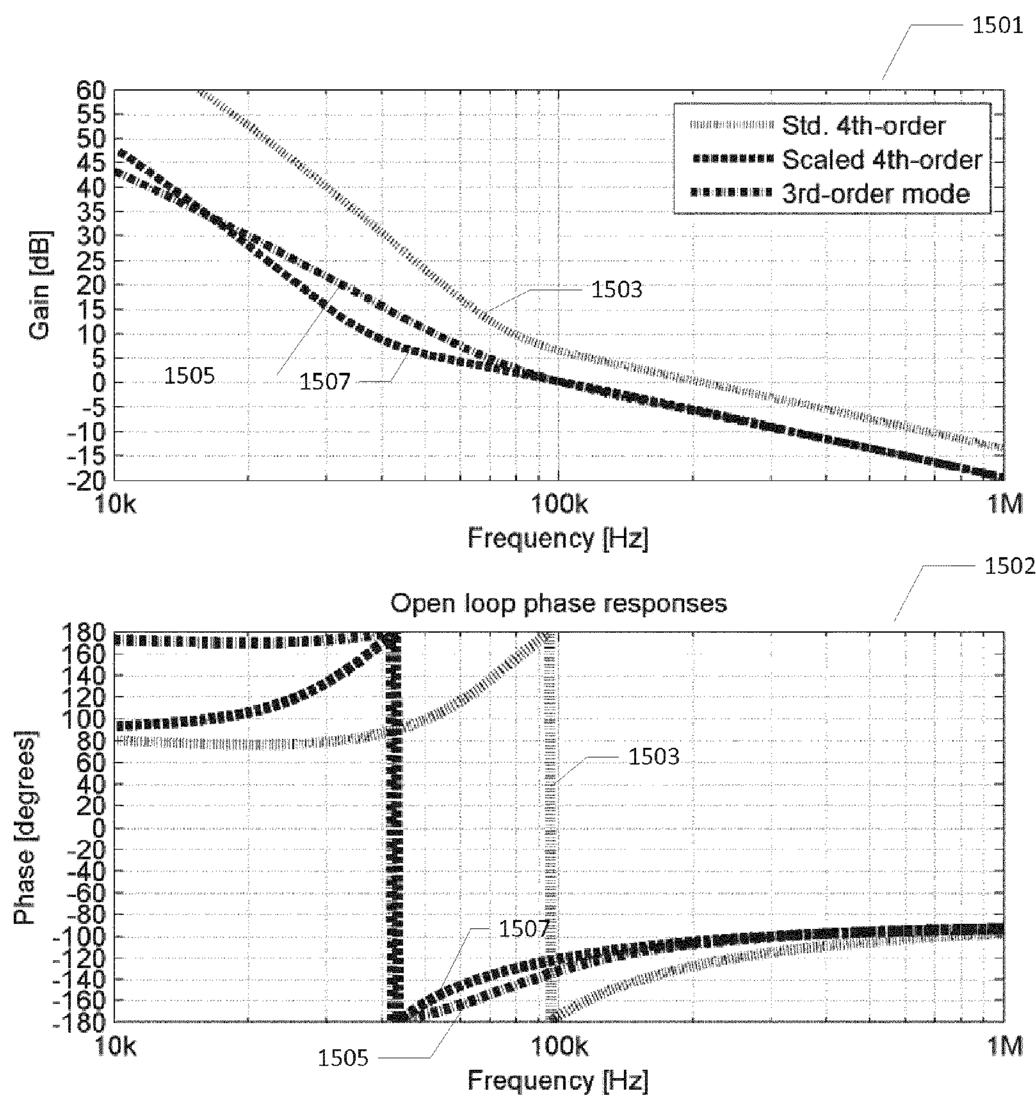
FIG. 5 is a plot of open loop magnitude and phase responses of the feedback loop of the present class D audio amplifier for three different settings of frequency response characteristics of the loop filter.

FIG. 5 comprises plots of magnitude and phase responses of the open loop gain of the feedback loop of the class D audio amplifier 1100 for three different settings of the frequency response characteristics of the loop filter 1117 (FIGS. 3 & 4). The first magnitude response curve 1503 of magnitude plot 1501 is computed for the fourth order low-pass filter setting of the loop filter applied at the maximum setting of the modulation frequency. The second magnitude response curve 1505 is computed for the third order setting of the low-pass setting of the loop filter effected with a bypass of the second integrator (1203 on FIG. 4) as discussed above. The third magnitude response curve 1507 is computed for a fourth order setting of the low-pass filter of the loop filter 117 where all integrator time constants have been scaled with a common factor of 2 such that the cut-off frequency is halved compared to the magnitude response curve 1503, but the response shape essentially maintained. The lower plot 1502 shows the corresponding phase response curves 1503, 105 and 1507 for the above three different settings of the magnitude response characteristics.

Figure 6:
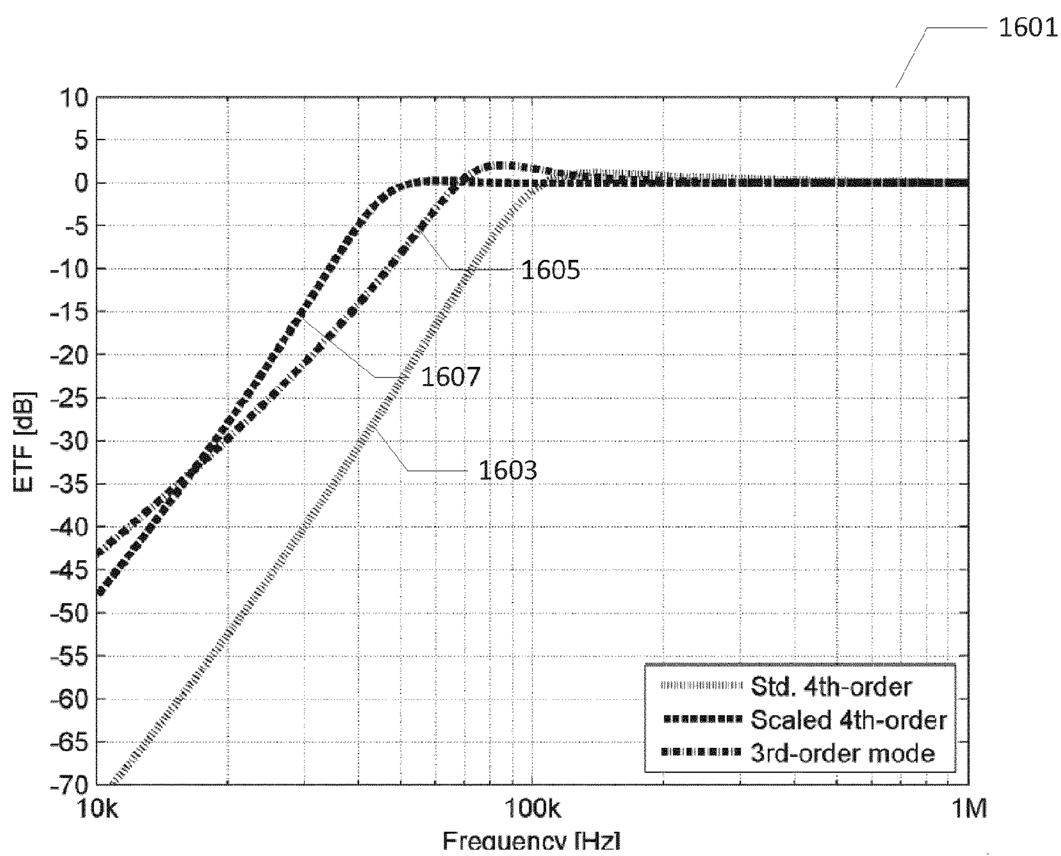
FIG. 6 is a plot of magnitude of an error transfer function (ETF) of the feedback loop of the present class D audio amplifier for the three different frequency response settings of the loop filter depicted on FIG. 5.

FIG. 6 is a plot 1601 of magnitudes of the error transfer function (ETF) of the feedback loop of the present class D audio amplifier for the three settings of frequency response characteristics of the loop filter depicted on the plots of FIG. 5. The suppression of noise and distortion at 20 kHz amounts to about 52 dB, for the nominal $4^{th}$ order setting of the loop filter and to about 28 and 30 dB for the scaled $4^{th}$ order and $3^{rd}$ order settings of the loop filter, respectively. The magnitude of the error transfer function (ETF) possesses high-pass characteristics which as expected from the low-pass integrator magnitude response of the loop filter. As previously mentioned output driver timing errors and aliasing errors tend to increase with increasing load or output power level of the class D amplifier. The adjustable loop filter ensures that the ETF has the highest suppression of such errors and noise mechanisms when this required for example through the previously mentioned audio level dependent switching between three different frequency response characteristics of the loop filter.

Figure 7:
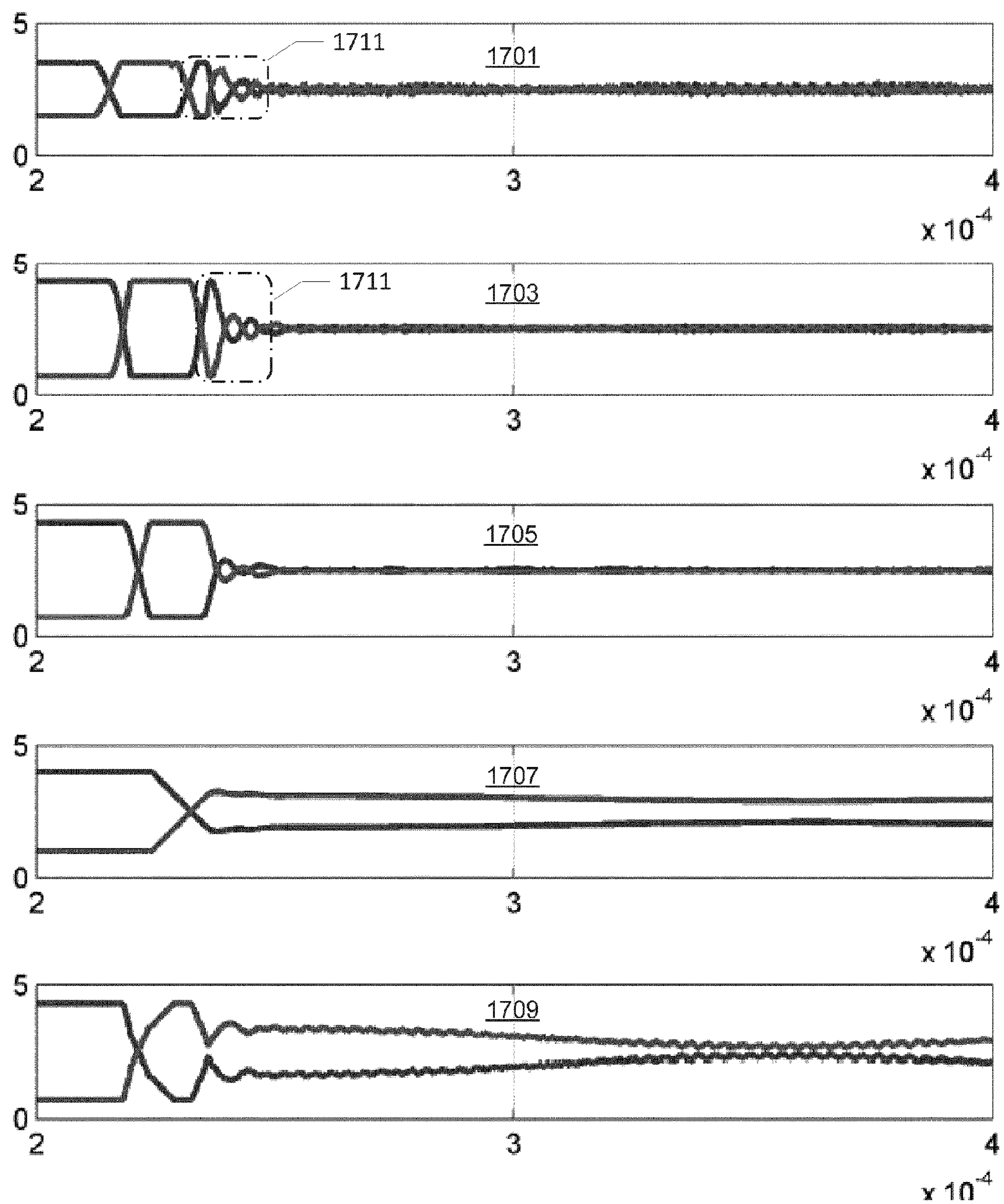
FIG. 7 shows a series of individual integrator output signals of the loop filter over time for unclamped integrators at start-up of the class D audio amplifier.

FIG. 7 shows a series of plots 1701, 1703, 1705, 1707, 1709 depicting individual integrator output signals of the four cascaded integrators 1301, 1303, 1305, 1307 and the summing amplifier 1309, respectively, of the loop filter 1117 depicted on FIG. 4. The X-axis scale shows time over a time span of approximately 200 μS. The plots of the integrator output signals are for the condition of unclamped integrator outputs. The loop filter operates in the standard $4^{th}$ order mode such that all cascaded integrators are placed in the signal path through the loop filter (i.e. none are bypassed). The oscillatory behaviour of the output signals of integrator No. 1 on plot 1701 and integrator No. 2 on plot 1703 during the time interval around 225-230 μS (inside window 1711) indicate that the feedback loop is close to instability at start-up or overload of the class D audio amplifier.

Figure 8:
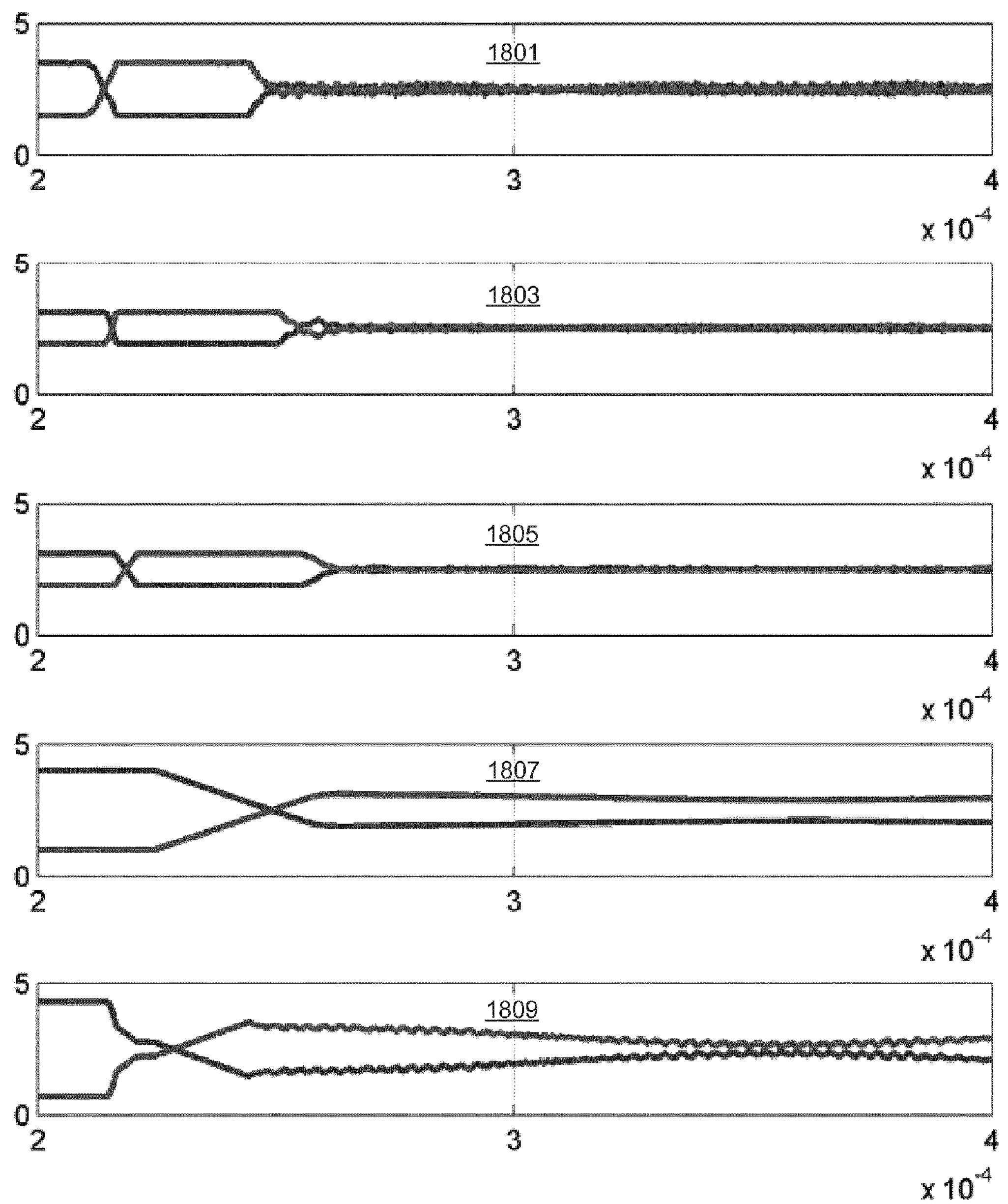
FIG. 8 shows a series of individual integrator output signals of the loop filter over time for clamped integrators at start-up of the class D audio amplifier, FIGS. 9A) and 9B) illustrate an H-bridge driver coupled to a loudspeaker load and pulse width modulated output signal waveforms of the H-bridge driver utilizing AD modulation in accordance with a first embodiment of the output driver, FIGS. 10*a*) and 10*b*) illustrate an H-bridge driver coupled to a loudspeaker load and pulse width modulated output signal waveforms of the H-bridge driver utilizing BD modulation in accordance with a second embodiment of the output driver.

FIG. 8 shows a second series of plots 1801, 1803, 1805, 1707, 1809 depicting individual integrator output signals of the four cascaded integrators 1301, 1303, 1305, 1307 and the summing amplifier 1309, respectively, of the loop filter 1117 depicted on FIG. 4. The X-axis scale shows time over a time span of approximately 200 μS. The plots of the integrator output signals are for the condition of clamped integrator outputs for integrator No. 2 (item 1303 of FIG. 4) and integrator No. 3 (item 1305 of FIG. 4). The residual integrators are left unclamped but the skilled person will understand that fewer or additional integrator outputs could be clamped in other embodiments of the invention. Preferably, at least integrator No. 2 and No. 3 of the integrator cascade are both clamped. The pronounced oscillatory behaviour of the output signals of integrator No. 1 on plot 1701 and integrator No. 2 on plot 1703 of FIG. 7 has been effectively suppressed as evident from inspection of the integrator outputs of the plots 1801 and 1803 compared to the same plots of FIG. 7. Hence, the stability and recovery time of the feedback loop have been markedly improved by the integrator output voltage clamping.

Figure 9:
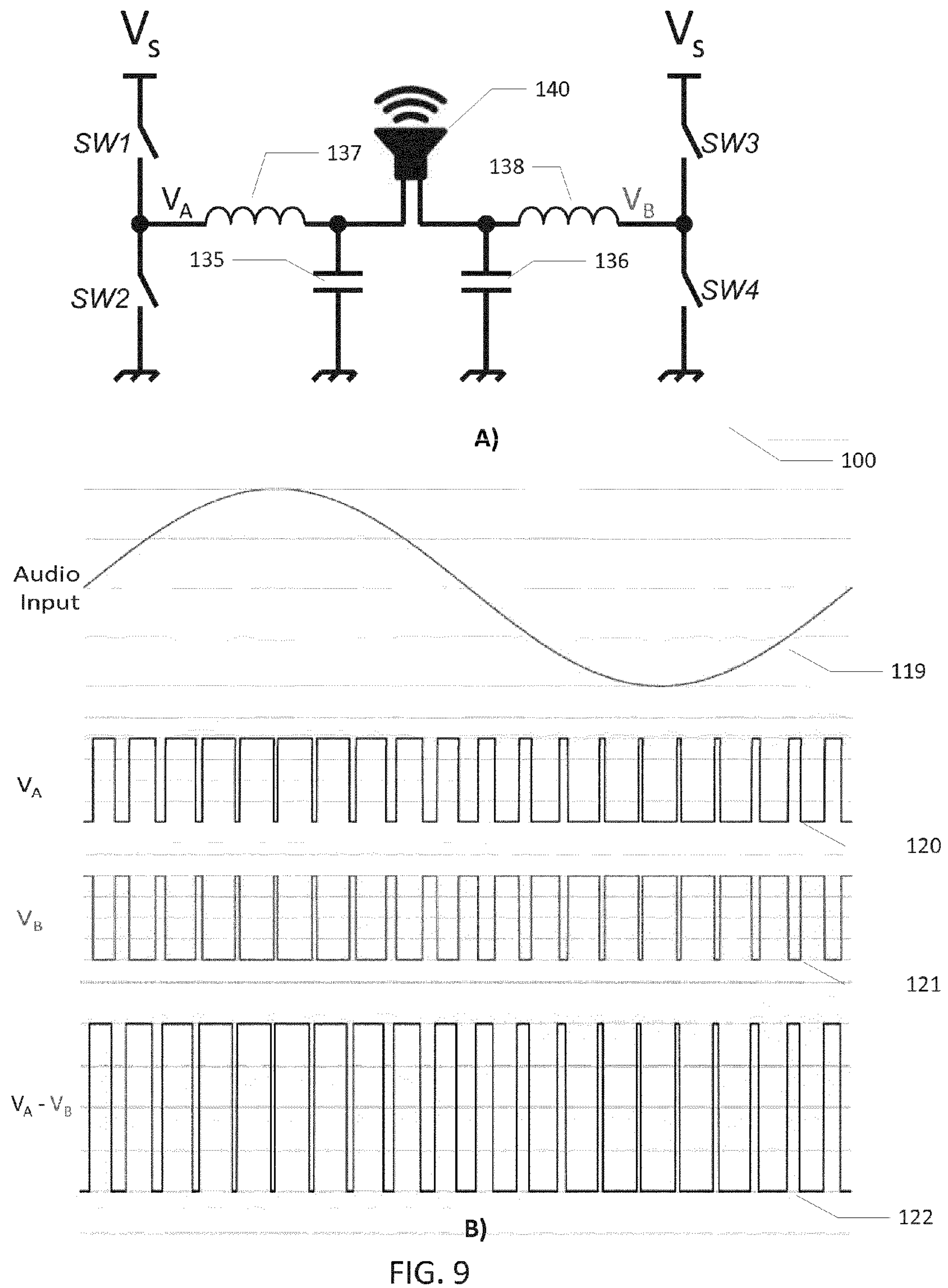

FIG. 9 illustrates schematically an H-bridge output driver 100 coupled to a loudspeaker load 140. One side of the H-bridge output driver 100 may be used as the first output driver of the schematically illustrated first output driver 1101 of FIG. 1. The second side of the H-bridge output driver 100 comprising switches SW3, SW4 may be used as a second output driver where the switches SW3, SW4 are driven by a second set of pulse width modulated control signals of appropriate phase generated by the controller. The H-bridge output driver 100 comprises output nodes $V_A$, $V_B$ that are coupled to respective sides of the loudspeaker load 140 to provide a differential or balanced load signal. The depicted modulated output signal waveforms 120, 121 on FIG. 9*b*) are provided at respective output nodes $V_A$, $V_B$ of the H-bridge output driver. The class D audio amplifier is configured for AD modulation of the balanced load signal such that the loudspeaker load 140 alternatingly is connected between a positive DC supply voltage $V_S$ and a negative DC supply voltage, such as GND, and vice versa in accordance with respective pulse width switch control signals applied to control terminals (not shown) of semiconductor switches SW1, SW2, SW3 and SW4. The alternating switching of the loudspeaker load between $V_S$ and GND as illustrated by output signal waveform 122 is obtained by in a first phase setting SW1 and SW4 to respective ON or conductive states and SW2 and SW3 to respective OFF states or off-states. In a second phase, SW1 and SW4 are set to respective OFF or non-conducting states and SW2 and SW3 to respective on-states. The audio input signal waveform that corresponds to the pulse width modulated output signal waveforms is illustrated by waveform 119. Load inductors 138, 137 are coupled between respective output nodes $V_A$, $V_B$ of the H-bridge output driver 100 and each side of the loudspeaker load 140. Likewise, load capacitors 136, 135 are coupled from each terminal or side of the loudspeaker load to GND. The combined operation of the load capacitors and load inductors is to provide lowpass filtering of the pulse width modulated output waveforms 120, 121 across the output nodes $V_A$, $V_B$ to suppress modulation or carrier frequency components in the output signal waveform across the loudspeaker load.

Figure 10:
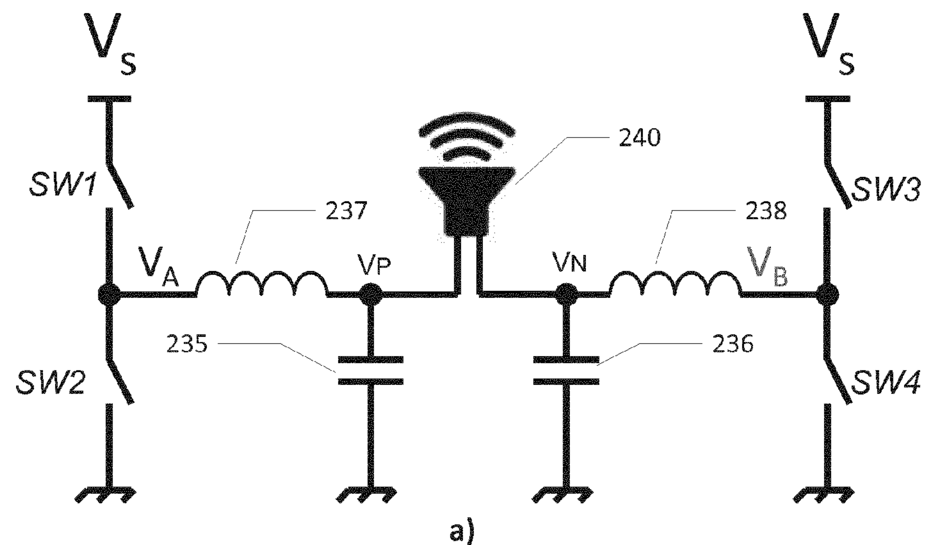
Figure 10:
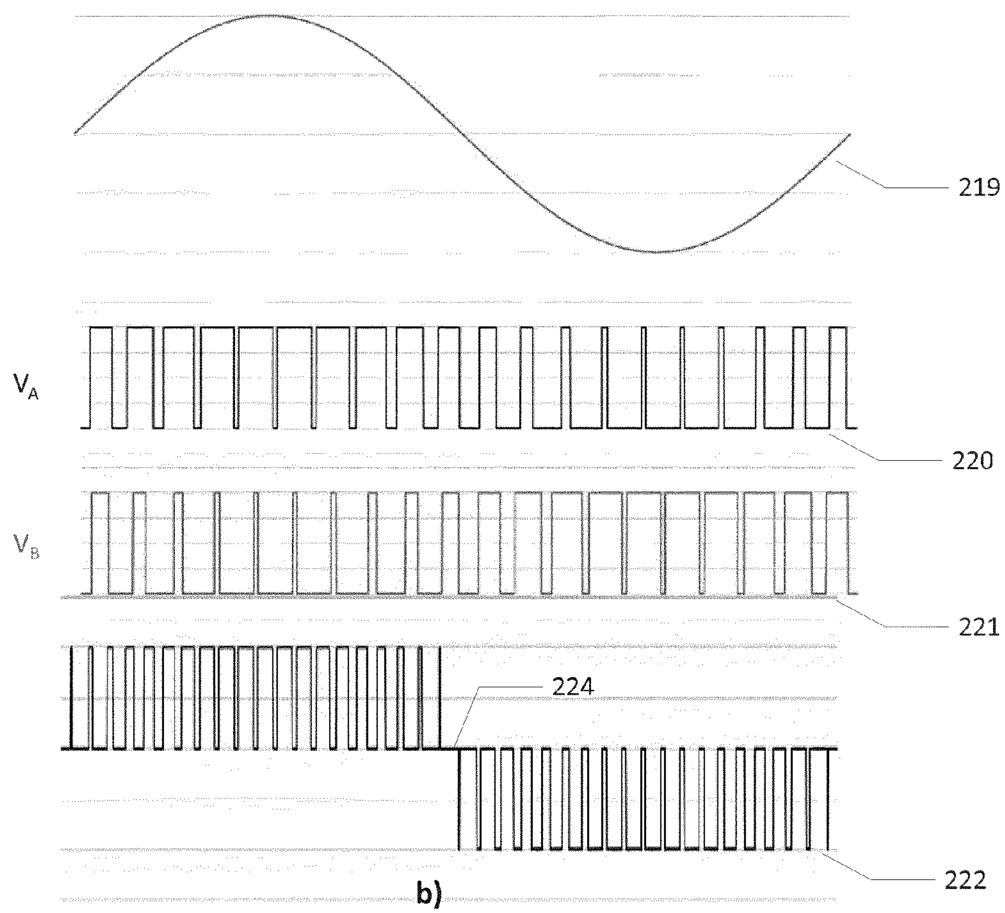

FIG. 10 illustrates another H-bridge output driver with similar topology to the H-bridge driver illustrated in FIG. 1 and coupled to the loudspeaker load 240. However, the present class D audio amplifier is configured for so-called BD modulation of the balanced output signal across output nodes $V_A$, $V_B$. In class BD modulation, zero states exist which involve setting the output nodes $V_A$, $V_B$ to the same state or supply voltage simultaneously, i.e. $V_S$ or GND, during certain time intervals. In the zero state both ends or terminals of the loudspeaker load 240 are simultaneously coupled or connected to either $V_S$ or to GND so as to set the driving voltage across the loudspeaker load 240 to zero. Consequently, when the level of the audio input signal is close to zero, switching of the pulse width modulated output waveforms 220, 221 at respective output nodes $V_A$, $V_B$ is discarded. This is illustrated in the pulse width modulated output waveform 222 at time instance marked by reference numeral 224 where amplitude of the audio input signal 219 crosses zero. However, despite the presence of states with zero-differential voltage across the loudspeaker load 240 it is important to notice that only two different states or voltage levels exist at each of the output nodes $V_A$, $V_B$ of the output driver, i.e. $V_S$ and GND.

Figure 2:
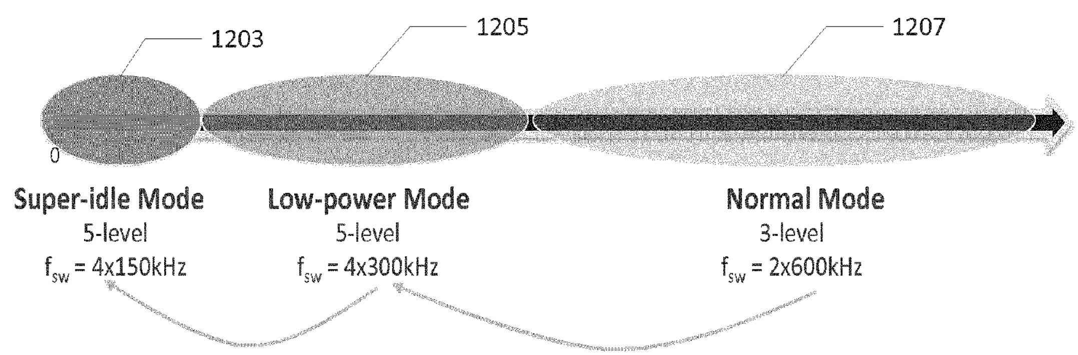
FIG. 2 illustrates a mode-switching scheme for operating the present class D audio amplifier in different operation modes dependent on a detected level of the audio input signal in accordance with the preferred embodiment of the invention.
Figure 11:
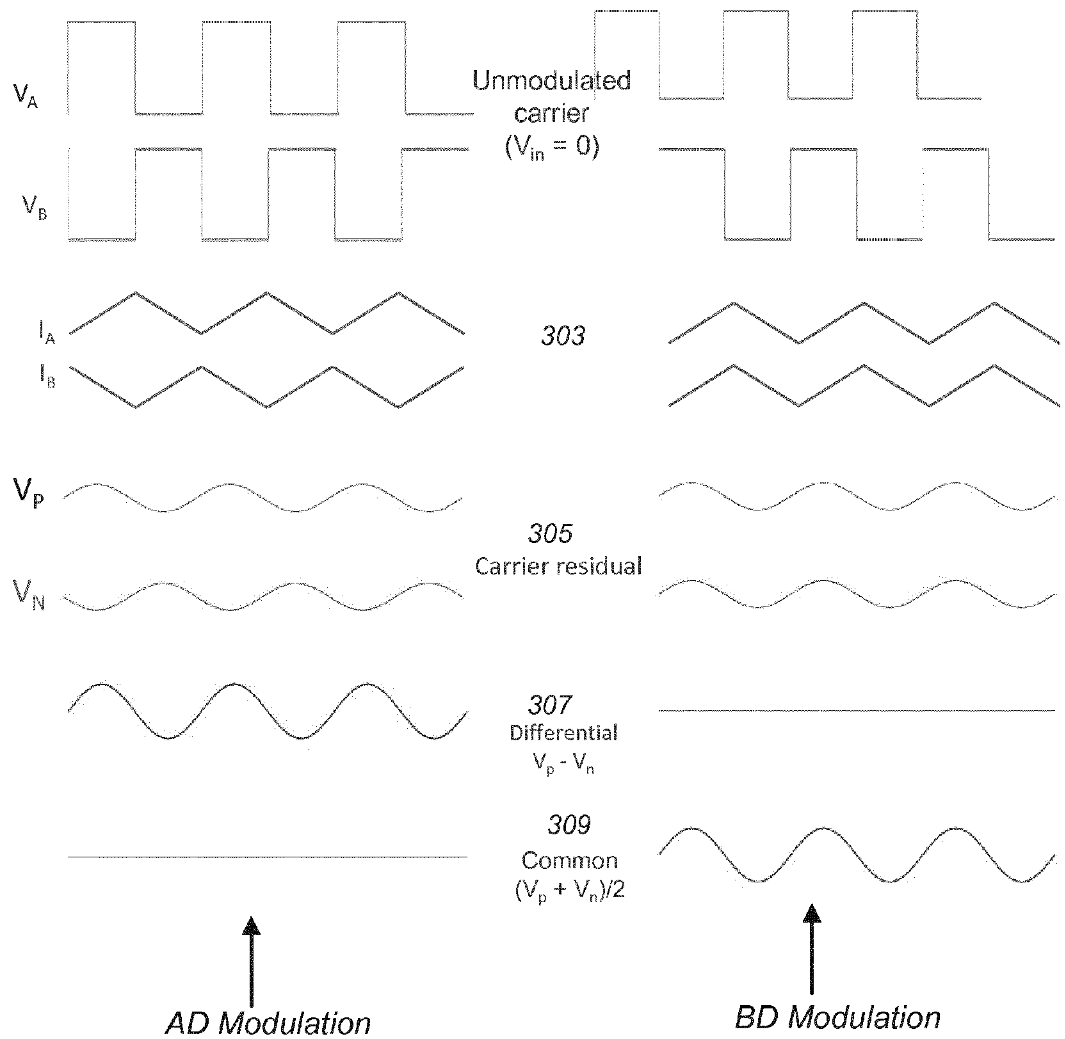
FIG. 11 shows load inductor ripple current waveforms and load capacitor ripple voltage waveforms for the H-bridge drivers depicted on FIGS. 9 and 10.

FIG. 11 illustrates inter alia load inductor ripple current waveforms and load capacitor ripple voltage waveform for the Class D amplifiers depicted on FIGS. 1 and 2. The waveforms illustrated in FIG. 11 correspond to a situation with zero level or amplitude of the audio input signal such that modulation of the pulse width modulated output waveforms at the first and second output nodes $V_A$, $V_B$ is zero. The waveforms on the left hand side of the drawing correspond to AD modulation as outlined above in connection with FIG. 9 while the right hand side waveforms depict the same voltage or current variables for class BD modulation as outlined above in connection with FIG. 10. The respective load inductor ripple current waveforms on waveform plots 303 reflect the integrating function of the load inductors 237, 238 and 137, 138 on the rectangular carrier waveform. The approximate sine-shaped load capacitor ripple voltage waveforms $V_P$ and $V_N$ on waveform plots 305 measured at the respective input terminals of the loudspeaker load reflect the lowpass filtering effect of the load capacitors 235, 236 and 135, 136 on the rectangular carrier waveforms. It is interesting to notice, that while the load capacitor ripple voltage waveforms $V_P$ and $V_N$ are of substantially identical amplitudes for class AD and class BD modulation, a differential ripple voltage, i.e. $V_P$ minus $V_N$, across the loudspeaker load as illustrated by waveforms 307 differs. For class AD modulation, the differential ripple voltage is twice the individual capacitor ripple voltages while the differential ripple voltage is about zero for class BD modulation. The lower level of ripple voltage for class BD modulation indicates a lower power loss in connection with the application of the pulse width modulated carrier waveforms to the loudspeaker load. However, despite the approximately zero differential ripple voltage across the loudspeaker load for class BD modulation, there still exist a significant common mode differential voltage as illustrated on common mode waveform plots 309 which leads to a power loss for this type of modulation. This is caused by load currents which are cycled back and forth through the load inductors causing power loss in a practical class D amplifier because real inductors possess inherent resistive and hysteresis losses.

FIG. 12 illustrates schematically an H-bridge output driver 401 coupled to a loudspeaker load 440 in accordance with a preferred embodiment of the invention utilizing a multi-level balanced load signal. In the present embodiment, a first DC voltage source is configured to set a third supply voltage, preferably one-half of $V_S$, at a first output node $V_A$ of a first output driver 425. A second DC voltage source is configured to set the third supply voltage, preferably one-half of $V_S$, at a second output node $V_B$ of a second output driver 426. The first and second DC voltage sources each comprises a charged flying capacitor as explained below.

Figure 13:
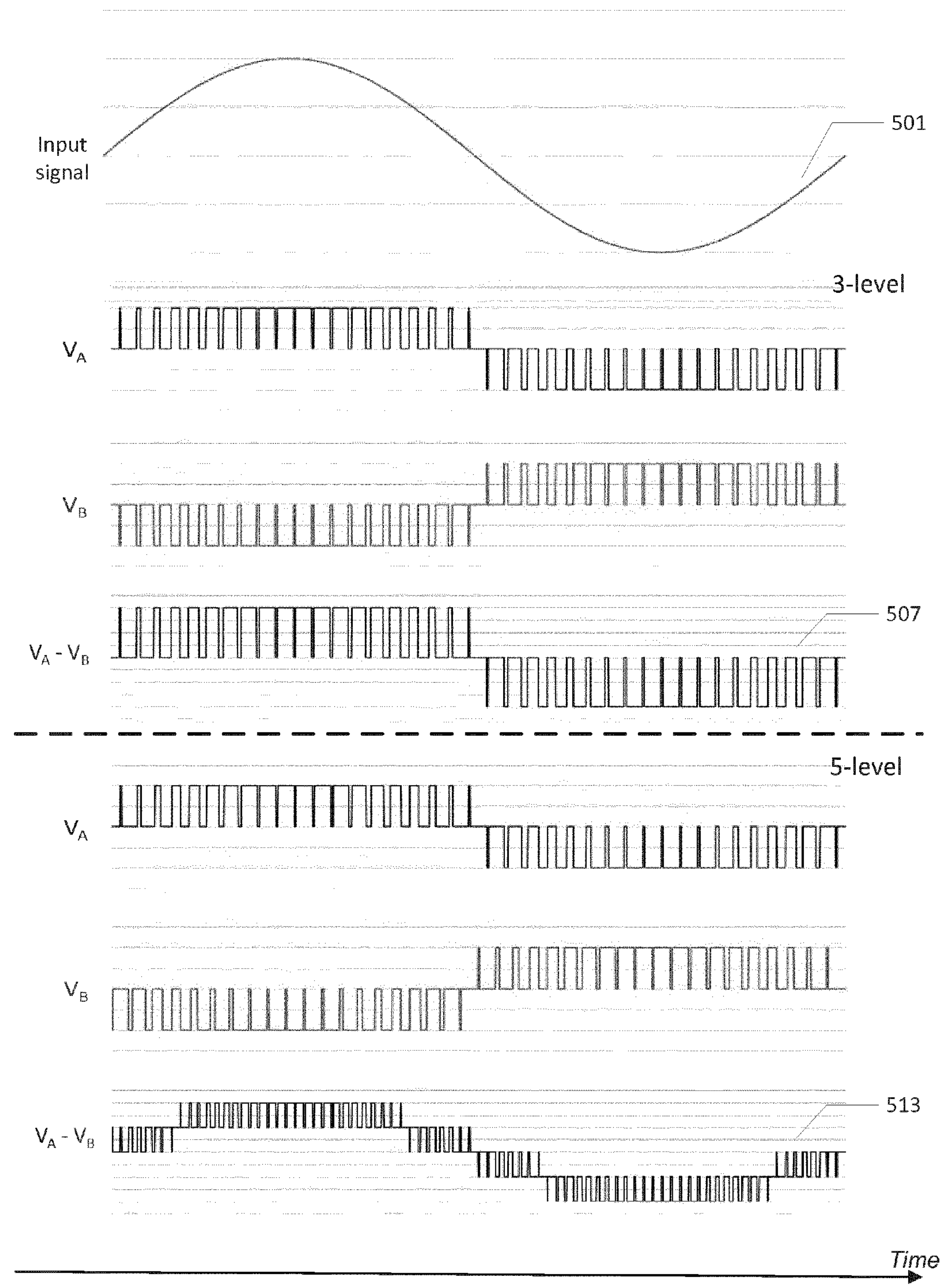
FIG. 13 illustrates three-level and five-level pulse width modulated output signal waveforms produced by the H-bridge output drivers depicted on FIG. 12 and FIG. 14.

The operation of the H-bridge output driver 401, where the loudspeaker load is operatively interconnected between a pair of output nodes $V_A$ and $V_B$ is explained in detail below while pulse width modulated output signal waveforms in differential format and at the first and second output nodes $V_A$ and $V_B$ are illustrated on FIG. 13. As explained in connection with the modulation mode switching scheme depicted on FIG. 2, the present class D audio amplifier is preferably configured to operate in the normal mode using 3-level modulation of the balanced load signal for large output power levels where the detected modulation duty cycle exceeds the upper modulation threshold. For lower output power levels, the present class D audio amplifier is preferably configured to operate in the low power or idle mode using 5-level modulation of the balanced load signal.

The H-bridge output driver 401 is operatively coupled to the loudspeaker load 440 through output nodes $V_A$ and $V_B$. The H-bridge output driver 401 comprises first and second substantially identical output drivers 425, 426, respectively. Each of the output drivers comprises four cascaded CMOS transistor switches, for example NMOS transistors, coupled between an upper DC supply voltage or rail $V_S$ and a lower DC supply voltage or rail in form of ground or GND rail. Furthermore, each output driver 425, 426 comprises a charged so-called flying capacitor $C_{fly1}$, $C_{fly2}$ 418, 419 that enable the generation of a third output level or mid-point voltage situated approximately midway between $V_S$ and GND at the output nodes $V_A$ and $V_B$ allowing the generation of multi-level balanced load signals as explained in further detail below. In the present embodiment, the upper leg A of a first output driver 425 of the H-bridge driver 401 comprises a pair of series or cascade coupled semiconductor switches such as CMOS transistors, preferably NMOS transistors. The series coupled semiconductor switches SW1 and SW2 are coupled to $V_S$ at a first end and the output node $V_A$ at an opposite end. The lower leg B of the first output driver 425 comprises another pair of series or cascade coupled CMOS semiconductor switches SW3 and SW4 coupled from the output node $V_A$ to GND. The upper leg C of the second output driver 426 of the H-bridge driver 401 comprises a pair of series or cascade coupled CMOS semiconductor switches SW5 and SW6 that preferably are identical in electrical characteristics to respective ones of the CMOS semiconductor switches SW1 and SW2 of leg A. The lower leg D comprises yet another pair of cascaded CMOS semiconductor switches SW7 and SW8 that preferably are identical in electrical characteristics to respective ones of the CMOS semiconductor switches SW3 and SW4 of leg B. The above-mentioned CMOS semiconductor switches are schematically illustrated on FIG. 4 as ideal switch elements controlled by respective gate or control terminals. Each of the semiconductor switches may be composed of a single semiconductor switch as schematically illustrated or may in other embodiments comprise a plurality of parallelly coupled individual semiconductor switches with common control terminals.

During operation of the H-bridge driver 401 in the class D audio amplifier depicted on FIG. 1, the controller is configured to apply the first set of pulse width modulated control signals of appropriate amplitude to respective ones of the first, second, third and fourth gate terminals (not shown) of the CMOS semiconductor switches SW1, SW2, SW3 and SW4, respectively, so as to controlling respective states of these CMOS semiconductor switches. Thereby, the state of each of the CMOS semiconductor switches may be toggled or switched between an on-state or ON and an off-state or non-conducting in accordance with transitions of the pulse width modulated control signal in question. The same applies for CMOS semiconductor switches SW5, SW6, SW7 and SW8 of the second output driver 426 which are supplied with a second set of pulse width modulated control signals at respective ones of the gate terminals. The on-resistance of each of the CMOS semiconductor switches SW1, SW2 in the on-state or conducting state or closed state may vary significantly according to requirements of a particular application, in particular an audio frequency impedance of the loudspeaker load 440. The on-resistance of semiconductor switches varies depending on switch dimensions, drive voltage at the control terminal, i.e. gate terminal in the present embodiment, and semiconductor process outcome. The semiconductor switches SW1, SW2 are preferably configured or designed to possess an on-resistance that is much smaller than an ohmic resistance of the loudspeaker load 440 such that power delivered through the output nodes $V_A$, $V_B$ predominantly is dissipated in the loudspeaker load 440 and to a smaller extent in the individual on-resistances of the semiconductor switches as switch power loss. The on-resistance of each of the CMOS semiconductor switches SW1, SW2, SW3, SW4, SW5, SW6, SW7 and SW8 is preferably set to a value between 0.05 and 5 ohm such as between 0.1 and 0.5 ohm in the present embodiment of the invention.

A loudspeaker load 440 which may comprise a moving coil, moving armature or other type of audio speaker is operatively coupled in-between the first and second output nodes $V_A$ and $V_B$ of the H-bridge driver 400. The loudspeaker load 440 typically includes a resistive component in series with significant inductive component. A first load inductor 438 and a first load capacitor 422 are coupled between the first output node $V_A$ and a first terminal of the loudspeaker load 440 so as to form a lowpass filter. The first load inductor 438 and a first load capacitor 422 may be provided as external components to an integrated circuit implementation of the first and second output drivers 425, 426 of the H-bridge driver. The lowpass filtering suppresses modulation or switching frequency components of the output waveform present at the output nodes $V_A$, $V_B$ in the load signal applied across the loudspeaker load 440. In the present embodiment, the first load capacitor 422 may have a capacitance between 100 and 500 nF such as about 220 nF. The first load inductor 414 may have an inductance between 1 μH and 5 μH such as about 2.20 μH. The respective values of a second load inductor 437 and a second load capacitor 423 coupled to the second output node $V_B$ are preferably identical.

The first flying capacitor 418 has one terminal coupled to a first connection node 418*a* between the pair of cascaded CMOS semiconductor switches SW1, SW2 of the upper leg A of the first output driver 425 to provide electrical connection between SW1, SW2 and the flying capacitor terminal. An opposite terminal of the first flying capacitor 418 is coupled to a second connection node 418*b* situated between the pair of cascade coupled CMOS semiconductor switches SW3, SW4 of the lower leg B of the first output driver 425. The first flying capacitor 418 is pre-charged to a predetermined DC voltage which equals about one-half of a DC voltage difference between $V_S$ and GND, i.e. simply one-half of $V_S$ because of the GND connection of the lower DC supply voltage, before operation of the present H-bridge driver 400 is commenced. The first flying capacitor 418 therefore acts as a DC voltage source which maintains or sets a DC voltage difference of one-half $V_S$ between the first and second connection nodes 418*a*, 418*b*. The controller (illustrated as item 1103 of FIG. 1) is configured to provide the pulse width modulated control signals applied to SW1 and SW4 in opposite phase and non-overlapping such that CMOS semiconductor switches SW1 and SW4 are never simultaneously in on-states or conducting with zero modulation of the pulse width modulated control signals, i.e. the audio signal input is zero. Likewise, the pulse width modulated control signals applied to SW2 and SW3 preferably have opposite phase and are non-overlapping at zero modulation of the pulse width modulated control signals such that CMOS semiconductor switches SW2 and SW3 are never ON or conducting simultaneously at zero modulation. This means that the first flying capacitor 418 in a first state of the first output driver 425 is coupled between $V_S$ and output node $V_A$ when SW1 and SW3 are simultaneously ON while SW4 and SW2 are both OFF leading to an output level of $V_S$ minus one-half of $V_S$, i.e. an output level at $V_A$ of one-half of $V_S$. In a second state of the first output driver 425, the first flying capacitor 418 is coupled between GND and the output node $V_A$ through SW2 and SW4 when these are simultaneously ON while SW1 and SW3 are both OFF leading to an output level of GND plus one-half of the DC supply voltage, i.e. one-half $V_S$ as was the case in the first state. Accordingly, the first flying capacitor is operative to generate a third supply voltage level at the output node $V_A$ equaling one-half of the DC supply voltage $V_S$ in the present embodiment. This third supply voltage level is generated in both the first and the second output driver state as outlined above because of the chosen adaptation of the DC voltage of the first flying capacitor 418 to one-half $V_S$. Accordingly, the output levels at the output node $V_A$ of the first driver 425 therefore toggles between three discrete levels: $V_S$, one-half $V_S$ and GND. Naturally, the GND voltage may in other embodiments comprise a negative or positive DC supply voltage for example a negative DC voltage substantially equal in magnitude to the first DC supply voltage.

The illustrated H-bridge output driver 401 comprises a second output driver 426 coupled to another side or terminal of the loudspeaker load 4440 through the second output node $V_B$. The circuit topology and electrical characteristics of the individual components such as CMOS semiconductor switches SW5, SW6, SW7, SW8 and the flying capacitor 419 of the second output driver 426 are preferably substantially identical to those of the corresponding components of the first output driver 425. Likewise, the external second load inductor 437 and the external second load capacitor 423 are preferably identical to the corresponding external components associated with the first output driver 425.

In the normal mode the pulse width modulated control signals are configured such that the signals for SW1 and SW5 are in opposite phase at zero modulation. The same applies for the respective pairs of pulse width modulated control signals applied to SW2 and SW6, to SW3 and SW7, to SW4 and SW8. This configuration of the pulse width modulated control signals ensures, in combination with the respective settings of the predetermined DC voltages of the flying capacitors $C_{fly1}$, $C_{fly2}$ (418, 419) to about one-half of the first DC supply voltage $V_S$, that the above-described 3-level pulse width modulated balanced output signal is generated between the first and second output nodes $V_A$ and $V_B$. This 3-level pulse width modulated output signal is illustrated as waveform 507 on FIG. 13. As illustrated the present 3-level pulse width modulated balanced output signal shares an advantageous property with the previously outlined prior art class BD modulation in that state switching rates at the first and second output nodes $V_A$ and $V_B$ are reduced when the audio signal input is close to zero. In the low power or idle mode of operation of the class D audio amplifier, the various pulse width modulated control signals are configured such that the signals for SW1 and SW5 are inverted and additionally phase shifted with +/−90 degrees relative to each other at zero modulation. The same applies for the respective pairs of pulse width modulated control signals applied to SW2 and SW6, to SW3 and SW7, to SW4 and SW8. This adaptation of the pulse width modulated control signals ensures, in combination with the setting of both of the predetermined DC voltages of the flying capacitors $C_{fly1}$, $C_{fly2}$ (418, 419) to about one-half of the first DC supply voltage $V_S$, that the desired 5-level pulse width modulated balanced output signal for the loudspeaker load is generated between the first and second output nodes $V_A$ and $V_B$. This 5-level pulse width modulated balanced output signal is illustrated as output waveform 513 on FIG. 13. The output signal waveform 513 shows two discrete levels of pulse width modulated waveforms above zero, a zero level and 2 discrete levels of pulse width modulated waveforms below zero. As illustrated the present 5-level pulse width modulated output signal shares an advantageous property with the previously outlined class BD modulation and 3-level modulation in that state switching rates at the first and second output nodes $V_A$ and $V_B$ are reduced when the audio signal input is close to zero.

Figure 14:
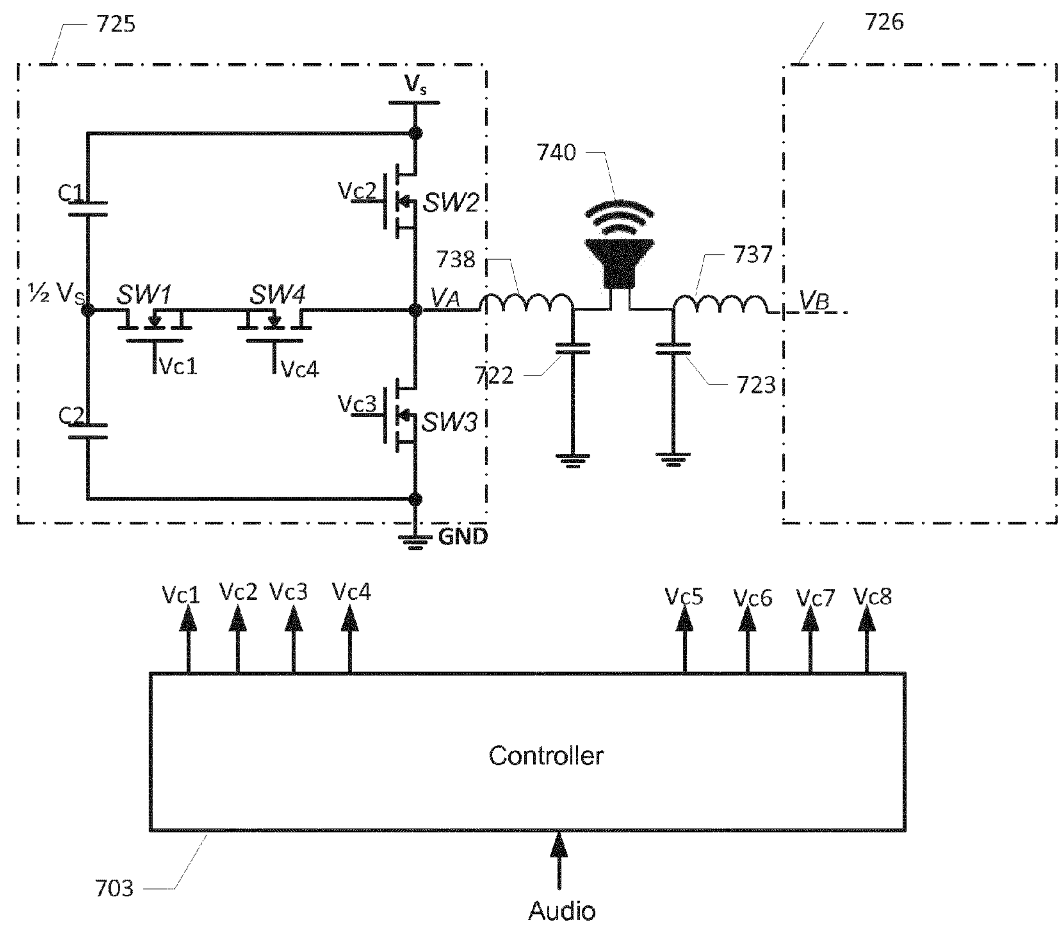
FIG. 14 is a schematic diagram of an H-bridge output driver coupled to a loudspeaker load in accordance with in accordance with a fourth embodiment of the output driver, FIGS. 15A) and 15B) illustrate the generation of pulse width modulated control signals for each of the semiconductor switches of the H-bridge output driver depicted on FIG. 12 in a three-level operational mode and a five-level operational mode, respectively, FIGS. 16A) and 16B) show load capacitor ripple voltage and load inductor ripple current, respectively, versus modulation duty cycle for the H-bridge driver illustrated on FIGS. 9 and 10 (class AD and BD modulation) in comparison with the H-bridge driver depicted on FIG. 12 operating in three-level modulation.

FIG. 14 is a schematic diagram of a class D audio amplifier with an H-bridge output driver comprising first and second output drivers 725, 726, respectively, coupled to a loudspeaker load 740 in accordance with a fourth embodiment of the class D audio amplifier. The illustrated a class D audio amplifier also utilizes a multi-level balanced load signal. In the present embodiment, a first DC voltage source is configured to set a third supply voltage, preferably one-half of $V_S$, at a first output node $V_A$ of a first output driver 725. A second DC voltage source is configured to set the third supply voltage, preferably one-half of $V_S$, at a second output node $V_B$ of a second output driver 726. The first and second DC voltage sources comprises respective pairs of capacitive voltage dividers and semiconductor switches to generate one-half of $V_S$ voltage levels as explained below in further detail.

The topology of each of the output drivers 725, 726 is often referred to as a "neutral-point clamped" three-level half-bridge. A first load inductor 738 and a first load capacitor 722 is coupled between a first output node $V_A$ of the first driver 725 and a first terminal of the loudspeaker load 740 to form a lowpass filter. Another lowpass filter is formed by a second load inductor 737 and a second load capacitor 723 which are coupled between a second output node $V_B$ of the second driver 726 and a second terminal of the loudspeaker load 740. The purpose and characteristics of each of these lowpass filters are the same as those previously discussed in connection with the first embodiment of output driver 401. The first output driver 725 comprises an upper leg with a first semiconductor switch SW2 coupled in series between a first supply voltage $V_S$ and a first output node $V_A$ of the first output driver. A second leg comprises a second semiconductor switch SW3 is coupled in series between GND, i.e. a second supply voltage, and $V_A$. A third and fourth semiconductor switch SW1 and SW4, respectively, are coupled in series between the third supply voltage, i.e. a mid-point voltage ½ $V_S$ and $V_A$. The mid-point voltage ½ $V_S$ is generated by third supply voltage source as a third supply voltage for the first and, optionally second, output driver 725, 726. The third supply voltage source comprises a pair of supply capacitors, C1 and C2, coupled in series between the first supply voltage $V_S$ and GND voltage to provide the mid-point voltage. The supply capacitors, C1 and C2 preferably have substantially equal capacitance such that the mid-point voltage is set to approximately one-half of the first supply voltage $V_S$. Each of the semiconductor switches, SW1, SW2, SW3 and SW4 comprises a gate terminal Vc1, Vc2, Vc3 and Vc4 to control the state of the semiconductor switch in question. The semiconductor switches, SW1, SW2, SW3 and SW4 may comprise respective CMOS transistors such as NMOS transistors.

The second output driver 726 comprises the second output node $V_B$ which is coupled to an opposite side or terminal of the loudspeaker load 740. The second output driver 726 comprises semiconductor switches SW5, SW6, SW7 and SW8 coupled in a circuit topology similar to that of the first output driver 725. The second output driver 726 may comprise a separate third supply voltage source, preferably similar to the third supply voltage source of the first output driver, to generate a mid-point voltage. Alternatively, the mid-point voltage generated for the first output driver 725 may be utilized by the second output driver as well. The circuit topology of the second output driver 726 and electrical characteristics of its individual components are preferably substantially identical to those of the first output driver 725.

A controller 703 is configured to receive an audio input signal, Audio, and derive a first set of pulse width modulated control signals and a second set of pulse width modulated control signals therefrom. The first set of pulse width modulated control signals are illustrated by Vc1, Vc2, Vc3 and Vc4 which are applied to the gate terminals of CMOS semiconductor switches SW1, SW2, SW3 and SW4, respectively. The second set of pulse width modulated control signals are illustrated by Vc5, Vc6, Vc7 and Vc8 which are applied to CMOS semiconductor switches SW5, SW6, SW7 and SW8, respectively, arranged inside the second output driver 726. The controller 703 is configured to control a predetermined phase relationship between the first set of pulse width modulated control signals and the second set of pulse width modulated control signals such that a three-level load signal is generated across the loudspeaker load 740 in the normal operation mode and a five-level load signal generated across the loudspeaker load 740 in the low power and idle mode discussed above. An exemplary illustration of the process for the generation of the first and second sets of pulse width modulated control signals is explained in additional detail below in connection with FIG. 15.

FIGS. 15*a*) and 15*b*) illustrate the generation of pulse width modulated control signals for each of the semiconductor switches of the H-bridge output driver 401 depicted on FIG. 12. The pulse width modulated control signals $SW_1$-$SW_8$ are derived by a switching pattern mapping circuit (1119 of FIG. 1) of the controller 1103 (on FIG. 11) from the audio input signal. The illustrated waveform shapes of the pulse width modulated control signals $SW_1$-$SW_8$ of FIGS. 15*a*) and 15*b*) are mapped for a predetermined non-zero instantaneous level of the audio input signal, i.e. with modulation. FIG. 15*a*) illustrates the generation of pulse width modulated control signals in the three-level operation mode of the class D audio amplifier 1100 of FIG. 1 while FIG. 15*b*) illustrates the generation of pulse width modulated control signals in the five-level operation mode. In both operation modes, the analog PWM 1115 depicted on FIG. 1 is configured to derive four pulse width modulated signals $\phi_0$, $\phi_{90}$, $\phi_{180}$ and $\phi_{270}$ successively phase-shifted 90 degrees from each other and convey these to the switching pattern mapping circuit 1119.

In the three-level operation mode depicted on FIG. 15*a*), the switching pattern mapping circuit performs a phase selection by selecting pulse width modulated signals $\phi_0$ and $\phi_{180}$ the pulse width modulated control signals $SW_1$ and $SW_2$ for semiconductor switches SW1 and SW2 of the first output driver (item 425 of FIG. 12). The switching pattern mapping circuit furthermore generates a pair of pulse width modulated control signals $SW_3$ and $SW_4$ that are in opposite phase, or inverted, relative to $SW_2$ and $SW_1$, respectively, as the pulse width modulated control signals for semiconductor switches SW3 and SW4 of the first output driver. From the selected pulse width modulated signals $\phi_0$ and $\phi_{180}$ the switching pattern mapping circuit furthermore generates pulse width modulated control signals $SW_8$ and $SW_7$ for semiconductor switches SW8 and SW7 of the second output driver (item 426 of FIG. 12). The switching pattern mapping circuit furthermore generates a pair of pulse width modulated control signals $SW_5$ and $SW_6$ that are in opposite phase to $SW_8$ and $SW_7$, respectively, as the pulse width modulated control signals for the semiconductor switches SW8 and SW7 of the second output driver. Consequently, in the three-level operation mode the switching pattern mapping circuit is configured to generate a first set of modulated control signals in form of the pulse width modulated control signals $SW_1$, $SW_2$, $SW_3$ and $SW_4$ for the first output driver that are in opposite phase, or inverted, relative to corresponding pulse width modulated control signals of a second set of pulse width modulated control signals $SW_5$, $SW_6$, $SW_7$ and $SW_8$ for the second output driver. In this manner the pulse width modulated control signals $SW_1$ for the first output driver is rendered in opposite phase to the corresponding pulse width modulated control signal $SW_5$ for the second output driver, $SW_2$ for the first output driver rendered in opposite phase to the corresponding pulse width modulated control signal $SW_6$ for the second output driver and so on.

In the five-level operation mode depicted on FIG. 15*b*), the switching pattern mapping circuit performs a phase selection by selecting and re-arranging all pulse width modulated signals $\phi_0$, $\phi_{90}$, $\phi_{180}$ and $\phi_{270}$ as illustrated before generating the first set of modulated control signals in form of the pulse width modulated control signals $SW_1$, $SW_2$, $SW_3$ and $SW_4$ for the first output driver. By comparison with FIG. 15*a*), it is evident that the respective waveforms of the pulse width modulated control signals $SW_1$, $SW_2$, $SW_3$ and $SW_4$ of the first output driver are identical in the three-level and five-level operation modes. However, the waveforms of the second set of control signals in form of the pulse width modulated control signals $SW_5$, $SW_6$, $SW_7$ and $SW_8$ of the second output driver differ between the three-level and five-level operation modes as illustrated. The switching pattern mapping circuit is configured to generate pulse width modulated control signals in the second set of pulse width modulated control signals $SW_5$, $SW_6$, $SW_7$ and $SW_8$ for the second output driver that are inverted and additionally phase shifted with minus 90 degrees relative to the corresponding pulse width modulated control signals of the first set of pulse width modulated control signals $SW_1$, $SW_2$, $SW_3$ and $SW_4$ for the first output driver. In this manner the pulse width modulated control signal $SW_5$ for the second output driver is rendered inverted and with an additional minus 90 degrees phase shift relative to the corresponding pulse width modulated control signal $SW_1$ for the first output driver, $SW_6$ for the second output driver rendered inverted and additionally phase shifted minus 90 degrees relative to the corresponding pulse width modulated control signal $SW_2$ for the first output driver and so on.

The skilled person will understand that a N-level load signal can be generated from a set of modulated control signals with (N−1) different control signal phases having a phase difference of 360/(N−1) degrees. A three-level load signal is provided by setting N=3=>N−1=2 different control signal phases=>360/(3−1)=180 degrees phase shifted. Likewise, a five-level load signal is provided by setting N=5=>N−1=4 different control signal phases=>360/(5−1) =90 degrees phase shifted. Furthermore, a seven-level load signal is provided by setting N=7=>N−1=6 different control signal phases=>360/(5−1)=60 degrees phase shifted and so on. N being a positive integer number, preferably an uneven integer number.

Figure 16:
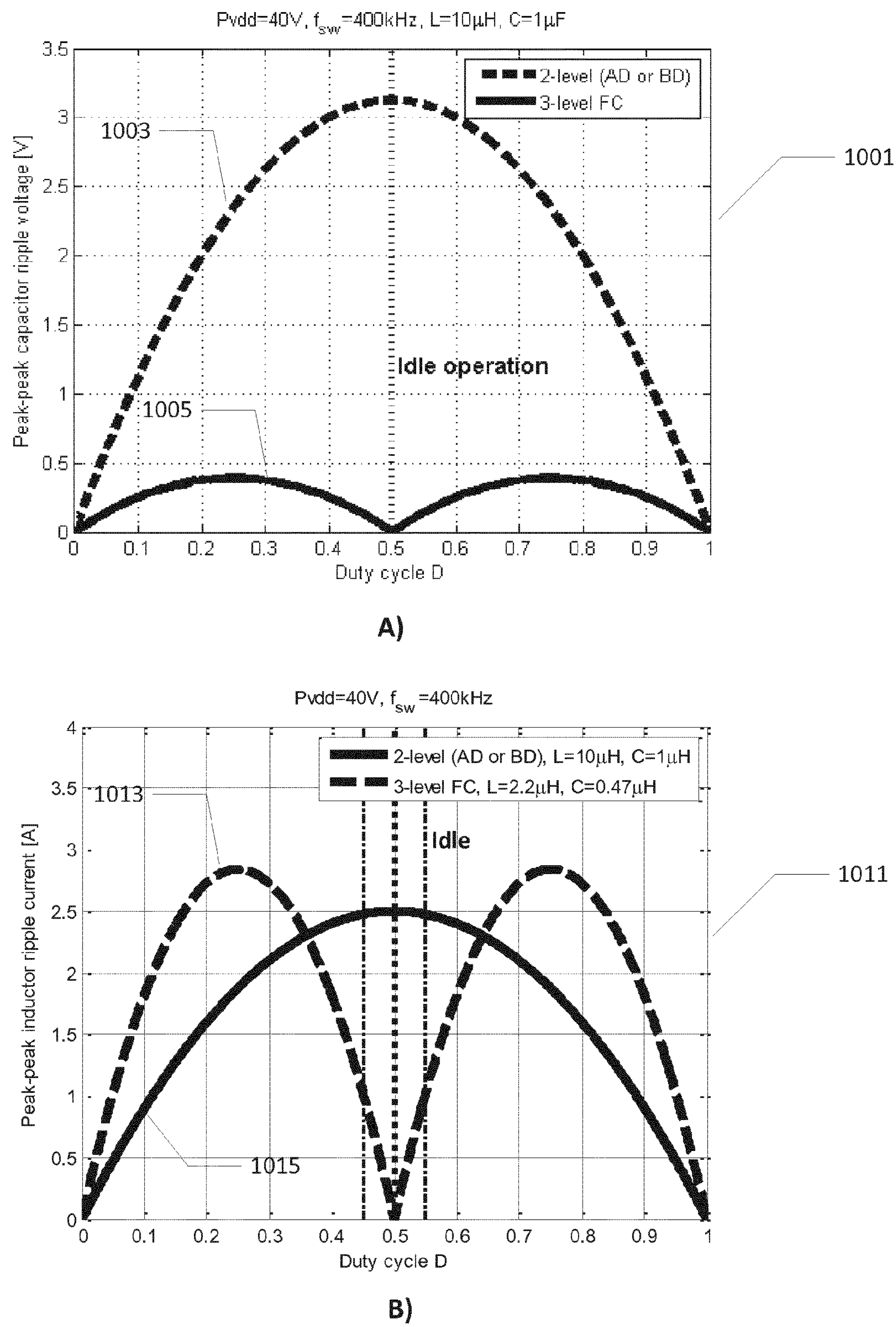

FIGS. 16A) and 16B) are respective graphs of load capacitor ripple voltage and load inductor ripple current, respectively, plotted versus modulation duty cycle of the pulse width modulated switch control signals. A modulation duty cycle of 0.5 corresponds to zero modulation of the pulse width modulated audio signal which in turn corresponds to zero level of the audio input signal as indicated on the graph 1001 by the marking "Idle operation". The depicted graphs have been plotted for a load inductor value of 10 μH (refer to FIG. 12 item 438) and a load capacitor value of 1 μF (refer to FIG. 12 item 422). The first or upper DC supply voltage $V_S$ or $P_{VDD}$ of the H-bridge output driver 401 was set to 40 Volt. The modulation frequency was set to 400 kHz for both types of modulation such that the effective switching frequency for the 3-level FC case was 800 kHz in accordance with the earlier explained rules.

The graph 1001 of FIG. 16A) displays the load capacitor ripple voltage measured in Volts peak-to-peak on the load capacitor (item 422 of FIG. 12) for two different types of class D audio amplifiers. Curve 1003 shows capacitor ripple voltage for the prior art output drivers utilizing 2-level class AD or BD modulation as displayed on FIGS. 1, 2 and 3. The curve 1005 shows capacitor ripple voltage for the 3-level operation mode of the H-bridge output driver 401 of FIG. 12. A large reduction of the peak-to-peak capacitor ripple voltage, in particular around zero modulation, is evident. This decrease of capacitor ripple voltage leads to a very advantageous suppression or attenuation of EMI emissions from class D amplifier based on the multi-level H-bridge output driver 401 or even though more traditional H-bridge output driver topologies as those described in connection with FIG. 9 and FIG. 10 are useable as well.

Graph 1011 of FIG. 16B) displays the load inductor ripple current in the load inductor (item 438 of FIG. 12) measured in Amperes peak-to-peak for two different types of class D audio amplifiers. The curve 1013 shows load inductor ripple current for the traditional 2-level class AD or BD modulation output drivers displayed on FIGS. 9, 10 measured with a load inductor value of 10 μH and load capacitor value of 1 μF. The curve 1015 shows load inductor ripple current for the 3-level operation mode of the H-bridge output driver 401 of FIG. 12. However, in the latter case, the load inductor value is only 2.2 μH (compared to 10 μH for the traditional 2-level class AD or BD modulation output drivers) and the load capacitor value is 0.47 μF. A very large reduction of amplitude of the inductor ripple current is achieved around zero modulation, i.e. for small audio input signals that tend to dominate everyday listening situations, despite the significantly smaller values of load inductance and load capacitance for the present H-bridge output driver.

Figure 17:
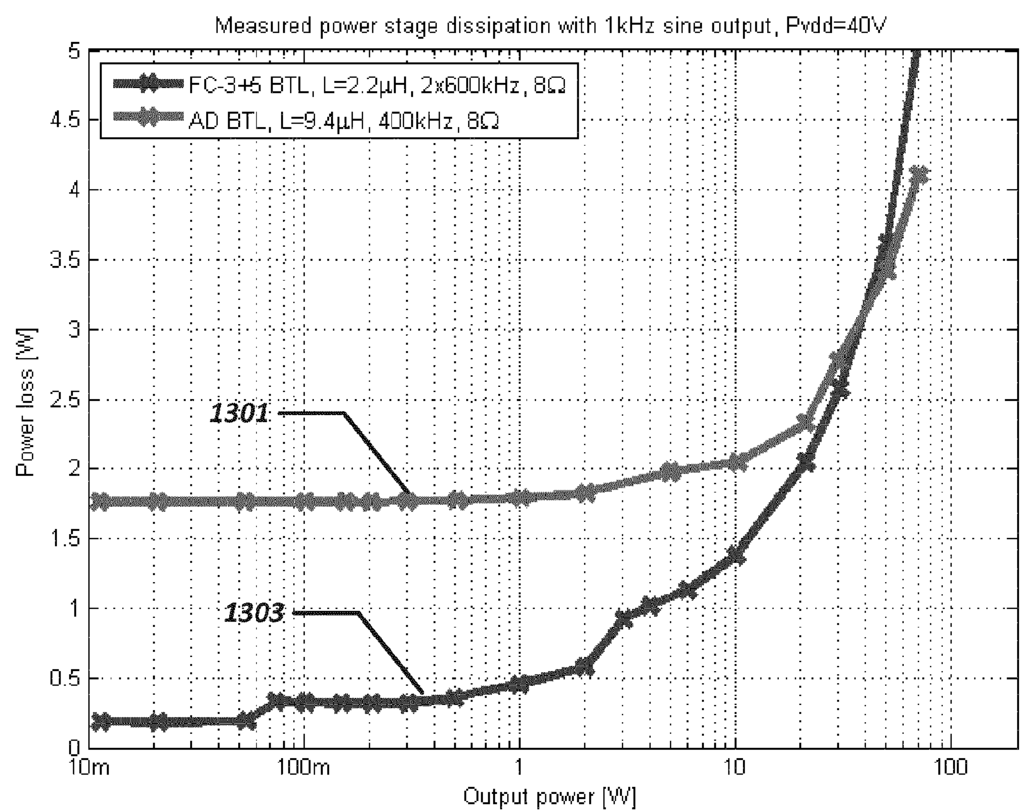
FIG. 17 illustrates experimentally recorded power loss data for the class AD H-bridge driver depicted on FIG. 9 and the multi-level H-bridge output driver depicted on FIG. 12.

FIG. 17 illustrates experimentally recorded power dissipation data for the traditional H-bridge output driver 100 depicted on FIG. 9 using AD modulation without the previously mentioned mode switching scheme in comparison to the multi-level H-bridge output driver 401 depicted on FIG. 12 applying the modulation duty cycle dependent mode switching scheme disclosed above in connection with FIG. 2. The audio input signal is a 1 kHz sine wave and the loudspeaker load is 8 ohm in both illustrated cases. The prior art H-bridge driver uses a load inductor value of 9.4 μH and a modulation frequency of 400 kHz. The H-bridge output driver in accordance with present invention uses a load inductor value of 2.2 μH and a modulation frequency of 600 kHz. Curve 1301 represents the measured power loss in Watts versus supplied load power or output power for the traditional H-bridge output driver 100 while curve 1303 represents the same figure of merit for the multi-level H-bridge output driver 401. As illustrated, a considerable reduction of power loss is offered by the multi-level H-bridge output driver 401 throughout the majority of the linear operation range of the H-bridge output drivers. The marked reduction in power loss for small values of the delivered output power such as output power levels smaller than 1 W, are particularly noticeable because this range of power levels is used in typical everyday listing situations. The measured power dissipation savings amount to a factor of about 9 (nine) for small values of the output or load power. It is also noticeable that this markedly improved energy efficiency is obtained without using larger load inductor or load capacitors values for the present H-bridge driver—on the contrary under the conditions for the experimentally recorded power loss data depicted on FIG. 16 the load inductor is significantly smaller.

The invention claimed is:

1. A class D audio amplifier comprising:

a first output driver comprising a first output node connectable to a loudspeaker load to supply a load signal thereto;

said first output driver comprising an upper leg having one or more semiconductor switches coupled between a first supply voltage and the first output node and a lower leg having one or more semiconductor switches coupled between the first output node and a second supply voltage, wherein each of the semiconductor switches comprises a switch control terminal adapted to control a state of the semiconductor switch to selectively place the semiconductor switch in its on-state or off-state;

a pulse width modulator for receipt of a filtered audio signal and generation of a first set of pulse width modulated control signals at an adjustable modulation frequency for respective switch control terminals of the first output driver;

a feedback loop comprising an adjustable loop filter and a summing node coupled to an audio input signal and a feedback signal derived from the load signal, the feedback loop being configured to couple the feedback signal to the summing node; and a controller configured to control frequency response characteristics of the adjustable loop filter based on a frequency setting of the adjustable modulation frequency of the first set of pulse width modulated control signals.

2. A class D audio amplifier according to claim 1, wherein the controller is configured to change an order of the adjustable loop filter based on the setting of the adjustable modulation frequency.

3. A class D audio amplifier according to claim 1, wherein the feedback loop has an open loop bandwidth between 0.01 and 1.0 times of the frequency setting of the adjustable modulation frequency.

4. A class D audio amplifier according to claim 2, wherein the controller is configured to select a higher order of the adjustable loop filter at a maximum frequency setting of the adjustable modulation frequency than at a minimum frequency setting of the adjustable modulation frequency.

5. A class D audio amplifier according to claim 1, wherein the adjustable loop filter comprises a plurality of cascaded integrators comprising respective integrator time constants and respective integrator gain coefficients.

6. A class D audio amplifier according to claim 5, wherein the controller is configured to adjust the respective integrator time constants of the plurality of integrators with a common scaling factor such as a scaling factor between 0.25 and 4 to control the frequency response characteristics of the adjustable loop filter.

7. A class D audio amplifier according to claim 5, wherein the controller is configured to scale the respective gain coefficients of the plurality of integrators with a plurality of scaling factors to control the frequency response characteristics of the adjustable loop filter.

8. A class D audio amplifier according to claim 5, wherein the adjustable loop filter comprises between 2 and 8 cascaded integrators.

9. A class D audio amplifier according to claim 5, wherein one or more of the cascaded integrators comprises output level clamping to limit maximum output level of the integrator such as a maximum output voltage level or a maximum current level.

10. A class D audio amplifier according to claim 1, further comprising a DC voltage source configured to set a third supply voltage at the first output node, such as a mid-point voltage, to provide a first tri-level load signal across the loudspeaker load.

11. A class D audio amplifier according to claim 10, wherein:

the upper leg of the first driver comprises a first and a second semiconductor switch coupled in cascade and the lower leg of the first driver comprises a third and a fourth semiconductor switch coupled in cascade;

the DC voltage source comprise a capacitor charged to the third supply voltage and coupled between a first node, located between the first and second cascaded semiconductor switches, and a second node, located between the third and fourth cascaded semiconductor switches; and the first set of pulse width modulated control signals are configured to:

in a first state, connecting a first terminal of the capacitor to the first output node through the first and third semiconductor switches; and in a second state, connecting a second terminal of the capacitor to the first output node through the fourth and second semiconductor switches.

12. A class D audio amplifier according to claim 1, further comprising:

a second output driver comprising a second output node connectable to the loudspeaker load to supply a balanced load signal thereto, said second output driver comprising an upper leg having one or more semiconductor switches coupled between the first supply voltage and the second output node and a lower leg having one or more semiconductor switches coupled between the second output node and the wherein each of the semiconductor switches of the second output driver comprises a switch control terminal adapted to control a state of the semiconductor switch to selectively place the semiconductor switch in its on-state or off-state; and the controller being further adapted to generate a second set of pulse width modulated control signals at the adjustable modulation frequency for respective switch control terminals of the second driver.

13. A class D audio amplifier according to claim 1, wherein the controller is configured to:

in a first operation mode, set a first predetermined phase relationship between the first and second sets of modulated control signals to generate a first multi-level balanced load signal across the loudspeaker load; and in a second operation mode, set a second predetermined phase relationship between the first and second sets of modulated control signals to generate a second multi-level balanced load signal across the loudspeaker load.

14. A class D audio amplifier according to claim 13, wherein the controller is configured to:

in the first operation mode, providing each control signal of the second set of modulated control signals with opposite phase relative to a corresponding control signal of the first set of modulated control signals to generate a three-level balanced load signal; and in the second operation mode, providing each control signal of the second set of modulated control signals with opposite phase and an additional +/−90 degrees phase shift relative to the corresponding control signal of the first set of modulated control signals to generate a five-level balanced load signal.

15. A class D audio amplifier according to claim 1, wherein the controller comprises an audio signal level detector, the controller being adapted to control the adjustable modulation frequency of the first set and/or second set of modulated control signals in dependence of a detected level of the audio input signal.

16. A class D audio amplifier according to claim 13, wherein the controller is adapted to switch between the first operation mode and the second operation mode in dependence of the detected level of the audio input signal.

17. A class D audio amplifier according to claim 16, wherein the controller is further adapted to:

comparing the detected level of the audio input signal with a predetermined level threshold; and set a first modulation frequency of the first set and/or second set of modulated control signals when the detected audio signal level is smaller than the predetermined level threshold and set a second modulation frequency of the first set and/or second set of modulated control signals when the detected audio signal level is larger than the predetermined level threshold, wherein the first modulation frequency is lower than the second modulation frequency.

18. A class D audio amplifier according to claim 17, wherein the controller is further adapted to:

selecting the first operation mode when the detected audio signal level exceeds the predetermined level threshold; and selecting the second operation mode when the detected audio signal level is smaller than the predetermined level threshold.

19. A class D audio amplifier according to claim 1, wherein the controller further comprises:

a sampling device coupled to the filtered audio signal and operating in accordance with a digital clock signal to generate a digital filtered audio signal to a digital pulse width modulator;

the digital pulse width modulator being configured to generate a uniformly sampled pulse width modulated audio signal; and the controller generating the first set and/or second set of pulse width modulated control signals based on the uniformly sampled pulse width modulated audio signal.

20. A class D audio amplifier according to claim 10, wherein the DC voltage source comprises at least one component from a group consisting of a charged capacitor, a floating DC supply rail, and a battery.

21. A class D audio amplifier according to claim 1, wherein an on-resistance of each of the semiconductor switches lies between 0.01Ω and 10Ω.

22. A class D audio amplifier according to claim 1, wherein each of the semiconductor switches comprises a transistor switch selected from a group of {Field Effect Transistors (FETs), Bipolar Transistors (BJTs), Insulated Gate Bipolar Transistors (IGBTs)}.

23. A class D audio amplifier according to claim 1, wherein the first and second supply voltages are configured to provide a DC voltage difference between 5 V and 120 V.

24. A class D audio amplifier according to claim 1, wherein a maximum modulation frequency of the first set of pulse width modulated control signals lies between 150 kHz and 5 MHz.

25. A sound reproducing assembly, comprising:

a class D audio amplifier according to any of the preceding claims; and a loudspeaker load operatively coupled to the output node of the first driver and one of the first and second DC supply voltages, or a loudspeaker load operatively coupled in-between the first and second output nodes of the first and second output drivers, respectively.

26. A sound reproducing assembly according to claim 25, further comprising:

a load inductor coupled between the output node of the first driver and the loudspeaker load; and a load capacitor coupled between the loudspeaker load and one of the first and second DC supply voltages.

27. A class D audio amplifier according to claim 1, wherein the feedback loop has an open loop bandwidth between 0.1 and 0.5 times, of the frequency setting of the adjustable modulation frequency.

28. A class D audio amplifier according to claim 1, wherein a maximum modulation frequency of the first set of pulse width modulated control signals lies between 500 kHz and 1 MHz.

* * * * *